United States Patent
Koyama

(10) Patent No.: US 8,520,796 B2
(45) Date of Patent: Aug. 27, 2013

(54) SIGNAL TRANSFER CIRCUIT AND IMAGE PICKUP DEVICE

(71) Applicants: Olympus Corporation, Tokyo (JP); Denso Corporation, Kariya (JP)

(72) Inventor: Yusaku Koyama, Tokyo (JP)

(73) Assignees: Olympus Corporation, Tokyo (JP); Denso Corporation, Kariya-shi (JP)

( * ) Notice: Subject to any disclaimer, the term of this patent is extended or adjusted under 35 U.S.C. 154(b) by 0 days.

(21) Appl. No.: 13/728,659

(22) Filed: Dec. 27, 2012

(65) Prior Publication Data

US 2013/0121455 A1 May 16, 2013

Related U.S. Application Data

(63) Continuation of application No. PCT/JP2011/065044, filed on Jun. 30, 2011.

(30) Foreign Application Priority Data

Jul. 2, 2010 (JP) .................................. 2010-152344

(51) Int. Cl.
*G11C 19/00* (2006.01)
(52) U.S. Cl.
USPC ............................................ 377/54; 348/294
(58) Field of Classification Search
None
See application file for complete search history.

(56) References Cited

U.S. PATENT DOCUMENTS

| | | | | |
|---|---|---|---|---|
| 4,034,301 A | * | 7/1977 | Kashio ............................ | 377/54 |
| 5,883,668 A | * | 3/1999 | Kazama et al. ................. | 348/303 |
| 5,909,247 A | * | 6/1999 | Hosokai et al. ................. | 348/302 |
| 6,567,340 B1 | * | 5/2003 | Nataraj et al. .................. | 365/236 |
| 7,629,914 B2 | * | 12/2009 | Muramatsu et al. ............ | 341/164 |
| 7,719,586 B2 | * | 5/2010 | Koseki et al. ................... | 348/300 |
| 8,174,594 B2 | * | 5/2012 | Koh ................................. | 348/294 |
| 8,330,834 B2 | * | 12/2012 | Korekado et al. .............. | 348/241 |
| 8,411,186 B2 | * | 4/2013 | Iwasa .............................. | 348/308 |
| 2009/0237534 A1 | * | 9/2009 | Okumura ........................ | 348/294 |
| 2010/0013969 A1 | * | 1/2010 | Ui .................................... | 348/294 |
| 2013/0002914 A1 | * | 1/2013 | Koyama .......................... | 348/294 |

FOREIGN PATENT DOCUMENTS

| | | |
|---|---|---|
| JP | 2000-165247 A | 6/2000 |
| JP | 2003-032113 A | 1/2003 |
| JP | 2007-124400 A | 5/2007 |
| JP | 2008-219930 A | 9/2008 |
| JP | 2009-005230 A | 1/2009 |
| JP | 2010-141685 A | 6/2010 |
| WO | 2009/151010 A1 | 12/2009 |

OTHER PUBLICATIONS

International Search Report of PCT/JP2011/065044, mailing date of Jul. 26, 2011.

* cited by examiner

*Primary Examiner* — Tuan T Lam
(74) *Attorney, Agent, or Firm* — Westerman, Hattori, Daniels & Adrian, LLP

(57) ABSTRACT

A signal transfer circuit may include first to $n^{th}$ switches that are respectively connected to bits of an n-bit digital signal output from a digital signal generating circuit and controlled by a transfer control circuit, a first memory circuit including first to $n^{th}$ memories that respectively hold bits of the n-bit digital signal input through the first to $n^{th}$ switches and are serially connected to each other, a second memory circuit including $(n+1)^{th}$ to $m^{th}$ memories that hold a digital signal and are serially connected to each other, an output signal of the $n^{th}$ memory of the first memory circuit being input to the $(n+1)^{th}$ memory of a first stage, and $(n+1)^{th}$ to $m^{th}$ switches that are connected to output signals of the $(n+1)^{th}$ to $m^{th}$ memories of the second memory circuit and controlled by a read control circuit.

7 Claims, 13 Drawing Sheets

SIGNAL TRANSFER CIRCUIT AND IMAGE PICKUP DEVICE

CROSS REFERENCE TO RELATED APPLICATIONS

This application is a continuation application based on a PCT Patent Application No. PCT/JP2011/065044, filed Jun. 30, 2011, whose priority is claimed on Japanese Patent Application No. 2010-152344, filed on Jul. 2, 2010, the entire content of which are hereby incorporated by reference.

BACKGROUND OF THE INVENTION

1. Field of the Invention

The present invention relates to a signal transfer circuit. Particularly, the present invention relates to a signal transfer circuit of a solid-state image pickup device including an analog-to-digital (AD) converting circuit for each column.

2. Description of the Related Art

In recent years, solid-state image pickup devices have been used in various devices such as still cameras, video cameras, medical endoscopic cameras, industrial endoscopic cameras, high-performance visual sensors for robots, and perimeter monitoring visual sensors for vehicles. Charged coupled device (CCD) image sensors and complementary metal-oxide semiconductor (CMOS) image sensors have been known as solid-state image pickup devices used in these devices.

A CMOS image sensor can be manufactured by the same technique as a general semiconductor manufacturing process, and thus the CMOS image sensor can have various functions due to various functional circuits embedded in a sensor. For example, as an image sensor in which a functional circuit is embedded in a sensor, Japanese Unexamined Patent Application, First Publication No. 2007-124400 discloses a technique related to an image sensor in which an AD converting circuit is provided for each column of a pixel array arranged in the form of a matrix, and a digital signal which has been subjected to AD conversion is output in units of rows.

For example, the image sensor in which an AD converting circuit is provided for each column may be provided with a circuit (hereinafter referred to as a "signal transfer circuit") for the purpose of performing a calculation process using signal information of a plurality of rows in the image sensor and performing an AD conversion operation and an external output operation in parallel temporally. For example, a signal transfer circuit for such a purpose may usually include a memory circuit, which holds a digital signal (signal information) of one or more rows of the image sensor, the memory circuit being disposed between a latch circuit that temporarily latches a digital signal output from the AD converting circuit and horizontal signal output lines for sequentially outputting the digital signal to the outside of the image sensor.

FIG. 12 is a circuit connection diagram illustrating an example of a connection of components related to transfer of a digital signal in an image sensor in accordance with the related art. The signal transfer circuit illustrated in FIG. 12 temporarily holds digital signals output from a digital signal generating circuit, which outputs a digital signal, such as an AD converting circuit arranged for each column, and then transfers the digital signals to the memory circuit. FIG. 12 illustrates components related to transfer of a digital signal (signal information) corresponding to one column of the image sensor.

An AD converting circuit 111 converts analog signals output from pixels (not shown) into an n-bit digital signal, and outputs respective bit signals to a latch circuit 211 through different lines. In the following description, a number in "( ): parentheses" following a symbol represents a bit of a digital signal. For example, a second bit of a digital signal is represented by "(2)."

The latch circuit 211 holds respective bits of the n-bit digital signal output from the AD converting circuit 111 in internal latches bit(1) to bit(n). Then, the latch circuit 211 outputs the held digital signal to a signal transfer line 411 through switches SWL(1) to SWL(n). The latch circuit 211 is for the purpose of reducing an output load when the digital signal is output from the AD converting circuit 111, and thus is arranged to be near the AD converting circuit 111 or built into the AD converting circuit 111.

A memory circuit 311 receives the digital signal output to the signal transfer line 411 through switches SWM(1) to SWM(n) and holds the digital signal in internal memories bit(1) to bit(n). Thereafter, the memory circuit 311 outputs the held digital signal to the outside according to control of a driving control circuit (not shown).

Here, transfer control of the digital signal (signal information) in the signal transfer circuit will be described. FIG. 13 is a timing chart illustrating a driving timing to transfer the digital signal in the signal transfer circuit of the image sensor in accordance with the related art. The timing chart illustrated in FIG. 13 illustrates a driving timing when the signal information held in the latch circuit 211 of the signal transfer circuit illustrated in FIG. 12 is sequentially transferred to the memory circuit 311.

Here, when the signal information held in the latch circuit 211 is transferred to the memory circuit 311, in a data transfer operation time period, the switch SWL(1) and the switch SWM(1) are first turned on, and thus the latch bit(1) of the latch circuit 211 is connected with the memory bit(1) of the memory circuit 311 through the signal transfer line 411. As a result, the signal information held in the latch bit(1) is transferred to the memory bit(1). Similarly, the switches SWL(2) to SWL(n) and the switches SWM(2) to SWM(n) are sequentially turned on, and thus the signal information held in each latch of the latch circuit 211 is sequentially transferred to each memory of the memory circuit 311.

In the signal transfer circuit that transfers the digital signal (signal information) from the latch circuit 211 to the memory circuit 311, all latches (the latches bit(1) to bit(n)) in the latch circuit 211 and all memories (the memories bit(1) to bit(n)) in the memory circuit 311, which are arranged in a column direction, are connected to the signal transfer line 411, and thus a line length of the signal transfer line 411 is long, and parasitic resistance is large. In addition, the switches SWL(1) to SWL(n) and the switches SWM(1) to SWM(n) which are connected to the signal transfer line 411 serve as parasitic capacitance.

Here, when loads such as parasitic resistance and parasitic capacitance become the cause of deteriorating the transferred digital signal and destroying the digital signal (signal information) when the digital signal is transferred at a high speed.

SUMMARY

The present invention provides a signal transfer circuit capable of reliably transferring signal information without deteriorating a transferred digital signal even when a digital signal is transferred at a high speed.

A signal transfer circuit in accordance with a preferred embodiment of the present invention may include: first to $n^{th}$ switches that are respectively connected to bits of an n-bit (n is a natural number larger than 1) digital signal output from a digital signal generating circuit and controlled by a transfer control circuit; a first memory circuit including first to $n^{th}$ memories that respectively hold bits of the n-bit digital signal input through the first to $n^{th}$ switches and are serially connected to each other; a second memory circuit including $(n+1)^{th}$ to $m^{th}$ (m is a natural number larger than 2) memories that hold a digital signal and are serially connected to each other, an output signal of the $n^{th}$ memory of the first memory circuit being input to the $(n+1)^{th}$ memory of a first stage; and $(n+1)^{th}$ to $m^{th}$ switches that are connected to output signals of the $(n+1)^{th}$ to $m^{th}$ memories of the second memory circuit and controlled by a read control circuit. Each of the first memory circuit and the second memory circuit may be controlled by the transfer control circuit such that a digital signal held in an $i^{th}$ (i is a natural number which is larger than 1 and equal to or less than n or m) memory is transferred to an $(i+1)^{th}$ memory of a next stage. The n-bit digital signal output from the digital signal generating circuit may be transferred from the first memory circuit to the second memory circuit, and then output through the $(n+1)^{th}$ to $m^{th}$ switches.

Also, an image pickup device in accordance with a preferred embodiment of the present invention may include: a pixel unit including a plurality of pixels, each of which includes a photoelectric conversion element and outputs a pixel signal corresponding to a quantity of light incident on the photoelectric conversion element, the pixels being two-dimensionally arranged; a timing control circuit that controls reading of the pixel signal from the pixel unit; an AD converter that outputs a digital signal obtained by performing analog-to-digital conversion on the pixel signal read from the pixel unit; the signal transfer circuit; and a horizontal read circuit that sequentially outputs a digital value output from the signal transfer circuit. The AD converter may function as a digital signal generating circuit that outputs a digital signal to the signal transfer circuit. The timing control circuit may function as a transfer control circuit that controls an input of a digital signal to the signal transfer circuit and transfer of a digital signal of the signal transfer circuit. The horizontal read circuit may function as a read control circuit that controls an output of a digital signal from the signal transfer circuit.

Preferably, an annular delay circuit that includes a plurality of delay units connected in an annular form and allows a pulse signal to propagate with a delay time according to a level of an analog input voltage and a counter that measures a circling number in which the pulse signal propagates along the annular delay circuit may be provided as the digital signal generating circuit that inputs a digital signal. The signal transfer circuit may further include an AD converter that outputs each of an output of each delay unit of the annular delay circuit and an output of the counter as a digital signal.

Preferably, the timing control circuit may control the first to $n^{th}$ switches of the signal transfer circuit by first control signals which are smaller in number than signal lines of a digital signal input to the signal transfer circuit. The timing control circuit may control the first memory circuit and the second memory circuit of the signal transfer circuit by second control signals which are smaller in number than signal lines of a digital signal transferred by the signal transfer circuit.

Preferably, all of the first to $n^{th}$ switches of the signal transfer circuit may be controlled by the first control signals. All of the first to $n^{th}$ memories of the first memory circuit of the signal transfer circuit and all of the $(n+1)^{th}$ to $m^{th}$ memories of the second memory circuit may be controlled by the second control signals.

Preferably, a plurality of AD converters and a plurality of signal transfer circuits may be arranged for each column of the pixel unit. The timing control circuit may control all the signal transfer circuits arranged for each column of the pixel unit through the first control signal and the second control signal output from the timing control circuit. The horizontal read circuit may sequentially output digital values from the plurality of signal transfer circuits.

Preferably, each of the first to $n^{th}$ memories and the $(n+1)^{th}$ to $m^{th}$ memories may hold the digital signal in each bit of one feed-back loop.

According to the present invention, it is possible to reliably transfer signal information without deteriorating a transferred digital signal even when a digital signal is transferred at a high speed.

DESCRIPTION OF THE PREFERRED EMBODIMENTS

First Preferred Embodiment

Figure 1:
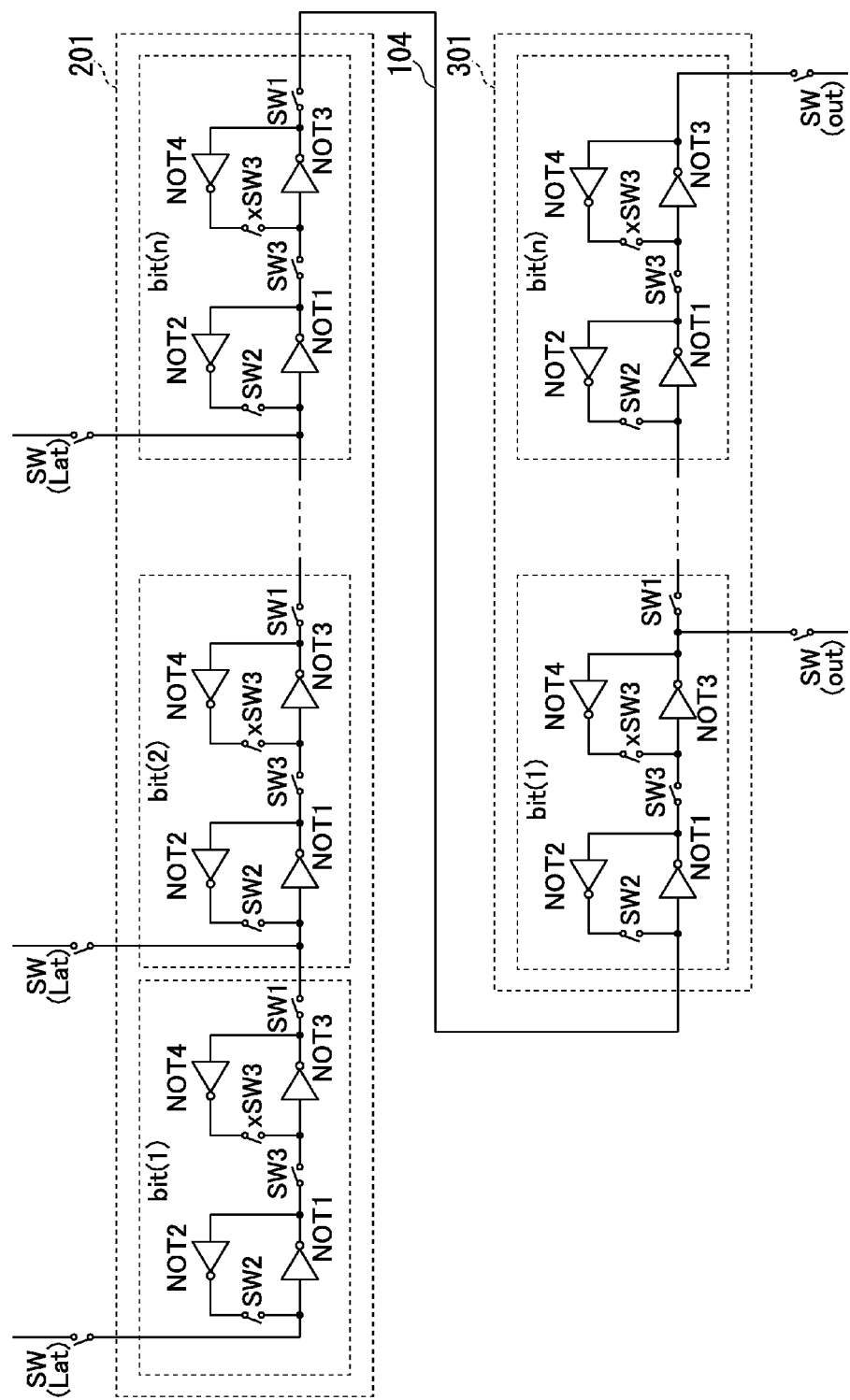
FIG. 1 is a circuit connection diagram illustrating an example of a detailed configuration of a signal transfer circuit in accordance with a first preferred embodiment of the present invention.

Hereinafter, preferred embodiments of the present invention will be described with reference to the accompanying drawings. FIG. 1 is a circuit connection diagram illustrating an example of a detailed configuration of a signal transfer circuit in accordance with a first preferred embodiment of the present invention. A signal transfer circuit illustrated in FIG. 1 includes a switch SW(Lat), a latch circuit 201, a signal transfer line 104, a memory circuit 301, and a switch SW(out). Latches bit(1) to bit(n) in the latch circuit 201 have the same circuit configuration as memories bit(1) to bit(n) of the memory circuit 301, respectively. However, a digital signal output from a digital signal generating circuit that outputs a digital signal such as an AD converting circuit is input to the latch circuit 201, and the memory circuit 301 outputs the held digital signal to the outside, and thus the latch circuit 201 and the memory circuit 301 are different in the position at which the switch SW(Lat) or the switch SW(out) is connected. Further, a number in "( ): parentheses" following a symbol of each component illustrated in FIG. 1 represents a bit of a digital signal. For example, a second bit of a digital signal is represented by "(2)."

First, components which are common in the latches bit(1) to bit(n) and the memories bit(1) to bit(n) will be described. In the following description, the latches bit(1) to bit(n) and the memories bit(1) to bit(n) are referred to as a "bit circuit."

The bit circuit includes a plurality of inverting circuits NOT1 to NOT4, a plurality of switches SW1 to SW3, and a switch xSW3. The inverting circuit NOT1 includes an input terminal connected to an output side end of the switch SW2, and an output terminal which is connected to an input terminal of the inverting circuit NOT2 and an input side end of the switch SW3. The inverting circuit NOT2 includes an input terminal connected to an output of the inverting circuit NOT1 and an output terminal connected to an input side end of the switch SW2. The inverting circuit NOT3 includes an input terminal connected to output side ends of the switch SW3 and the switch xSW3 and an output terminal which is connected to an input terminal of the inverting circuit NOT4 and an input side end of the switch SW1. The inverting circuit NOT4 includes an input terminal connected to an output of the inverting circuit NOT3 and an output terminal connected to an input side end of the switch xSW3.

Next, a connection between the bit circuits used as the latches bit(1) to bit(n) and the bit circuits used as the memories bit(1) to bit(n) will be described. The bit circuits used as the latches bit(1) to bit(n) are configured such that the input terminal of the inverting circuit NOT1 is further connected to an output side end of the switch SW(Lat), and receives a digital signal output from the digital signal generating circuit through the switch SW(Lat). Further, in the bit circuits used as the latches bit(2) to bit(n), the input terminal of the inverting circuit NOT1 is further connected to an output side end of the switch SW1 of the latches bit(1) to bit (n−1), and all the latches bit(1) to bit(n) are serially connected to each other (for example, tied in a row).

Further, the bit circuits used as the memories bit(1) to bit(n) are configured such that the output terminal of the inverting circuit NOT3 is further connected to an input side end of the switch SW(out), and the digital signal held in the bit circuit is output to the outside through the switch SW(out). Further, in the bit circuits used as the memories bit(2) to bit(n), the input terminal of the inverting circuit NOT1 is further connected to an output side end of the switch SW1 of the memories bit(1) to bit(n−1), and all the memories bit(1) to bit(n) are serially connected to each other (for example, tied in a row).

The output side end of the switch SW1 of the latch bit(n) is connected to the signal transfer line 104, and the signal transfer line 104 is further connected to the input terminal of the inverting circuit NOT1 of the memory bit(1). As described above, in the signal transfer circuit illustrated in FIG. 1, the latches bit(1) to bit(n) in the latch circuit 201 and the memories bit(1) to bit(n) in the memory circuit 301 are connected in the order of bits of the digital signals indicated by "( ): parentheses," and the latch circuit 201 is connected with the memory circuit 301 through the signal transfer line 104.

Figure 2:
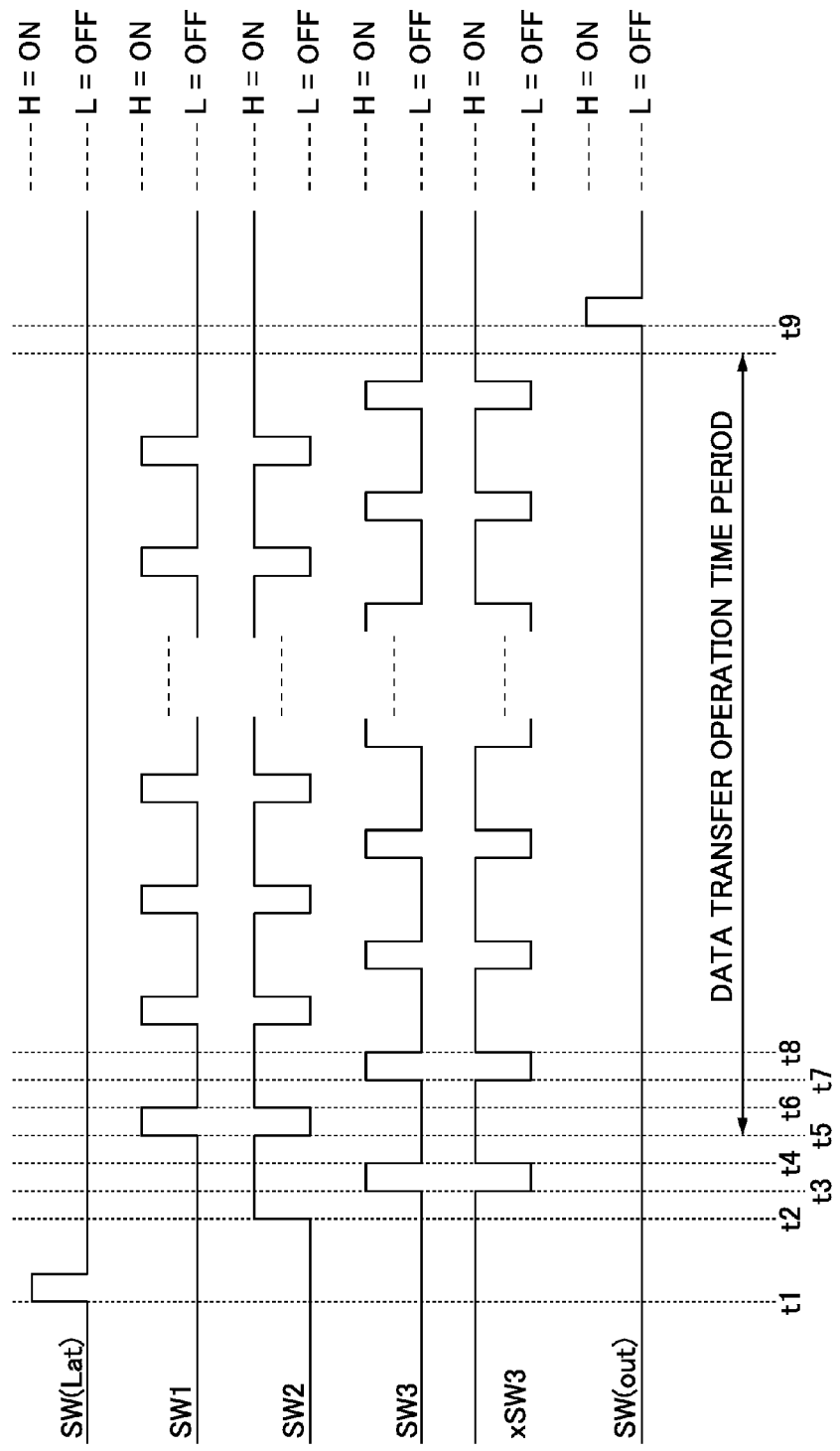
FIG. 2 is a timing chart illustrating a driving timing to transfer a digital signal in the signal transfer circuit in accordance with the first preferred embodiment of the present invention.

Next, transfer control of the digital signal (signal information) in the signal transfer circuit will be described with reference to FIGS. 1 and 2. FIG. 2 is a timing chart illustrating a driving timing to transfer a digital signal in the signal transfer circuit in accordance with the first preferred embodiment of the present invention. The timing chart illustrated in FIG. 2 represents a driving timing when the signal information held in the latch circuit 201 of the signal transfer circuit illustrated in FIG. 1 is sequentially transferred to the memory circuit 301. In transfer control of the digital signal (signal information) in the signal transfer circuit in accordance with the first preferred embodiment of the present invention, an ON/OFF operation of each of the switches (the switch SW(Lat), the switch SW(out), the switches SW1 to SW3, and the switch xSW3) is controlled by a driving control signal input from a timing control circuit (not illustrated). The following description will proceed with an example in which a state of each switch of the signal transfer circuit illustrated in FIG. 1 becomes a connection (ON) state when the driving control signal from the timing control circuit is at an "H" level, and becomes a disconnection (OFF) state when the driving control signal from the timing control circuit is at an "L" level. Further, the transfer control of the digital signal (signal information) will be described based on the status (ON or OFF) of each switch, and the level of the driving control signal input from the timing control circuit will also be described together.

First, when the switch SW(Lat) is turned on (the driving control signal transitions to the "H" level) in a state in which the switches SW1 to SW3 are turned off (the driving control signal transitions to the "L" level) and the switch xSW3 is turned on (the driving control signal transitions to the "H" level), a latch operation of a digital signal is performed. Through the latch operation, the digital signal output from the digital signal generating circuit is input to the input terminal of the inverting circuit NOT1 of the latches bit(1) to bit(n) (a timing t1). Thereafter, the switch SW(Lat) is turned off (the driving control signal transitions to the "L" level), and the switch SW2 is turned on (the driving control signal transitions to the "H" level) at a timing at which the data transfer operation time period starts. As a result, in each of the bit circuits of the latches bit(1) to bit(n), a feed-back loop is formed by the inverting circuit NOT1 and the inverting circuit NOT2, and thus the digital signal output from the digital signal generating circuit is held (a timing t2).

Then, as a data holding operation, the switch SW3 is turned on (the driving control signal transitions to the "H" level), and the switch xSW3 is turned off (the driving control signal transitions to the "L" level). As a result, an output of the inverting circuit NOT1 is input to the inverting circuit NOT3 (a timing t3). Thereafter, the switch SW3 is turned off (the driving control signal transitions to the "L" level), and the switch xSW3 is turned on (the driving control signal transitions to the "H" level). As a result, in each of the bit circuits of the latches bit(1) to bit(n), the feed-back loop is formed by the inverting circuit NOT3 and the inverting circuit NOT4, and thus the digital signal held by the feed-back loop of the inverting circuit NOT1 and the inverting circuit NOT2 is held (a timing t4). Thereafter, in the data transfer operation time period, the digital signals held in the latches bit(1) to bit(n) start to be transferred to the memories bit(l) to bit(n).

In the transfer of the digital signal, first, as a first transfer operation, the switch SW1 is turned on (the driving control signal transitions to the "H" level), and the switch SW2 is turned off (the driving control signal transitions to the "L" level). As a result, an output of the inverting circuit NOT3 is input to the inverting circuit NOT 1 of another bit circuit connected thereto (a timing t5). Thereafter, the switch SW1 is turned off (the driving control signal transitions to the "L" level), and the switch SW2 is turned on (the driving control signal transitions to the "H" level). As a result, the transferred digital signal is held by the feed-back loop formed by the inverting circuit NOT1 and the inverting circuit NOT2 in the bit circuit (a timing t6).

Through the first transfer operation, for example, the digital signal held in the latch bit(1) moves to the latch bit(2), and the digital signal held in the latch bit(2) moves to the latch bit(3). Further, the digital signal held in the latch bit(n) moves to the memory bit(1). In other words, the digital signal held in each bit circuit is sequentially transferred (shifted) to a neighboring bit circuit.

In addition, as a second transfer operation, the switch SW3 is turned on (the driving control signal transitions to the "H" level), and the switch xSW3 is turned off (the driving control signal transitions to the "L" level). As a result, an output of the inverting circuit NOT1 is input to the inverting circuit NOT3 (a timing t7). Thereafter, the switch SW3 is turned off (the driving control signal transitions to the "L" level), and the switch xSW3 is turned on (the driving control signal transitions to the "H" level). As a result, in each of the bit circuits of the latches bit(1) to bit(n), the feed-back loop is formed by the inverting circuit NOT3 and the inverting circuit NOT4, and thus the digital signal held in the feed-back loop formed by the inverting circuit NOT1 and the inverting circuit NOT2 is held (a timing t8).

Thereafter, in the data transfer operation time period, the first transfer operation and the second transfer operation are repeatedly performed until the digital signal held in the latch bit(1) moves to the memory bit(1), so that the digital signal output from the digital signal generating circuit is moved (transferred) from the latches bit(1) to bit(n) to the memories bit(1) to bit(n).

Thereafter, the switch SW(out) is turned on (the driving control signal transitions to the "H" level), and thus an output of the inverting circuit NOT3 in the memories bit(1) to bit(n) is output to the outside (a timing t9).

As described above, in the signal transfer circuit in accordance with the first preferred embodiment of the present invention, the digital signal output from the digital signal generating circuit can be reliably transferred from the latch circuit 201 to the memory circuit 301.

Further, in the signal transfer circuit in accordance with the first preferred embodiment of the present invention, since the bit circuit of the next stage is connected when each bit circuit transfers the digital signal, the line length between the bit circuits can be reduced, and the parasitic resistance of a signal line between the bit circuits can be reduced. In addition, a switch connected between the bit circuits is merely the switch SW(Lat) or the switch SW(out). Furthermore, even when the switch in each bit circuit is considered, the switch SW1 and the switch SW2 merely increase. Thus, the parasitic capacitance of the signal line between the bit circuits in the signal transfer circuit in accordance with the first preferred embodiment of the present invention can be reduced. Thus, the loads such as the parasitic resistance and the parasitic capacitance in the signal transfer circuit in accordance with the first preferred embodiment of the present invention can be reduced to be smaller than the loads such as the parasitic resistance and the parasitic capacitance in the signal transfer circuit in accordance with the related art. As a result, in the signal transfer circuit in accordance with the first preferred embodiment of the present invention, the transfer of the digital signal from the latch circuit 201 to the memory circuit 301 can be reliably performed at a high speed.

In addition, the signal transfer circuit in accordance with the first preferred embodiment of the present invention is small in the load such as the parasitic resistance or the parasitic capacitance, and thus the output load imposed on each bit circuit can be greatly reduced. As a result, in the signal transfer circuit in accordance with the first preferred embodiment of the present invention, each bit circuit can be configured to have a circuit size smaller than the signal transfer circuit of the related art. Further, in the image sensor in which an AD converting circuit is arranged for each column of a pixel array, for example, degradation in the AD conversion performance of the AD converting circuit is reduced, and the accuracy of AD conversion is increased, and thus it is effective to configure the signal transfer circuit to have a small circuit size.

First Applicable Aspect

Figure 3:
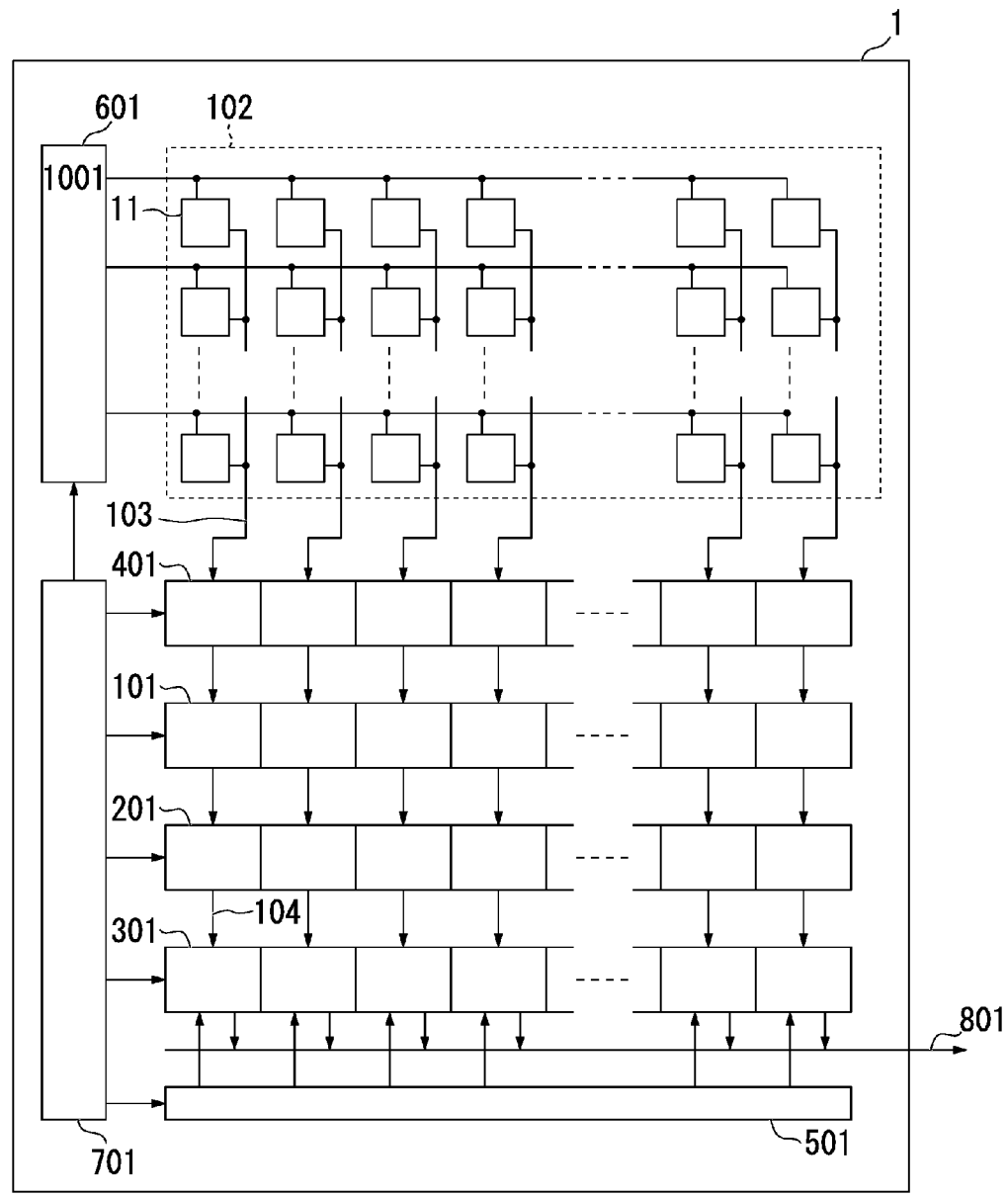
FIG. 3 is a block diagram illustrating a schematic configuration of an image sensor in accordance with a first applicable aspect when the signal transfer circuit in accordance with the first preferred embodiment of the present invention is applied to an image sensor.

Next, an example in which the signal transfer circuit in accordance with the first preferred embodiment of the present invention is applied to an image sensor will be described. FIG. 3 is a block diagram illustrating a schematic configuration of an image sensor in accordance with a first applicable aspect when the signal transfer circuit in accordance with the first preferred embodiment of the present invention is applied to an image sensor. In FIG. 3, an image sensor 1 includes a pixel array 102, a plurality of vertical signal lines 103, a plurality of correlated double sampling (CDS) circuits 401, a plurality of AD converting circuits 101, a plurality of latch circuits 201, a plurality of signal transfer lines 104, a plurality of memory circuits 301, a horizontal scanning circuit 501, a vertical scanning circuit 601, a timing generator 701, and a horizontal signal line 801.

The timing generator 701 outputs a driving control signal for driving each of the CDS circuit 401, the AD converting circuit 101, the latch circuit 201, the memory circuit 301, the horizontal scanning circuit 501, and the vertical scanning circuit 601 according to a driving mode of the image sensor 1.

The vertical scanning circuit 601 outputs a pixel driving signal for driving unit pixels 11 arranged in the pixel array 102 in units of rows in response to the driving control signal input from the timing generator 701. The pixel driving signal output from the vertical scanning circuit 601 includes a row selecting signal for driving the unit pixels 11 in units of rows, and in FIG. 3, a row selecting signal line 1001 is illustrated as the row selecting signal.

The pixel array 102 includes a plurality of unit pixels 11, each of which includes a photoelectric conversion element arranged two-dimensionally in a row direction and a column direction. The unit pixel 11 converts received light signal information into an analog signal in response to the pixel driving signal input from the vertical scanning circuit 601, and outputs the converted analog signal to the vertical signal line 103 of each column of the pixel array 102 for each row of the pixel array 102. The unit pixels 11 are driven in units of rows in the pixel array 102 in response to the row selecting signal including the row selecting signal line 1001, which is input from the vertical scanning circuit 601.

The CDS circuit 401 is connected to the vertical signal line 103 of each column, and performs differential processing between a signal of a reset level generated when each unit pixel 11 is in a dark period state and a signal of a light level generated when light is incident in response to the driving control signal output from the timing generator 701. Then, the CDS circuit 401 outputs a pixel analog signal Vin which is a differentially processed signal to the AD converting circuit 101.

The AD converting circuit 101 is arranged to correspond to the CDS circuit 401 of each column, and converts the pixel analog signal Vin input from the CDS circuit 401 into an n-bit digital signal in response to the driving control signal output from the timing generator 701.

The latch circuit 201 is arranged to correspond to the AD converting circuit 101 of each column, and holds respective bits of the n-bit digital signal in an internal latch with a memory function when the AD conversion operation of the AD converting circuit 101 ends. Then, the latch circuit 201 outputs the held n-bit digital signal to the signal transfer line 104 in response to the driving control signal output from the timing generator 701.

The memory circuit 301 is arranged to correspond to the latch circuit 201 of each column, and holds respective bits of the n-bit digital signal output from the latch circuit 201 to the signal transfer line 104 in an internal memory with a memory function in response to the driving control signal output from the timing generator 701.

The horizontal scanning circuit 501 outputs the driving control signal to the memory circuit 301 in response to the driving control signal input from the timing generator 701, and thus the n-bit digital signal held in the memory circuit 301 is output to the horizontal signal line 801 through which the output signal of the image sensor 1 is output to the outside.

In the image sensor 1 in accordance with the first applicable aspect of the present invention illustrated in FIG. 3, the latch circuit 201, the signal transfer line 104, an the memory circuit 301 correspond to the signal transfer circuit of FIG. 1 in accordance with the first preferred embodiment of the present invention. The signal transfer circuit in accordance with the first preferred embodiment of the present invention is provided for each column of the pixel array 102. In the signal transfer circuit of each column in the image sensor 1 of the first applicable aspect of the present invention, the switch SW(Lat), the switches SW1 to SW3, and the switch xSW3 in the signal transfer circuit in accordance with the first preferred embodiment of the present invention illustrated in FIG. 1 are controlled by the driving control signal output from the timing generator 701, and the digital signal output from the AD converting circuit 101 of each column of the pixel array 102 is transferred from the latch circuit 201 to the memory circuit 301 of each column. Further, the switch SW(out) in the signal transfer circuit is controlled by the horizontal scanning circuit 501, and the digital signal held in the memory circuit 301 is output to the horizontal signal line 801.

Figure 4:
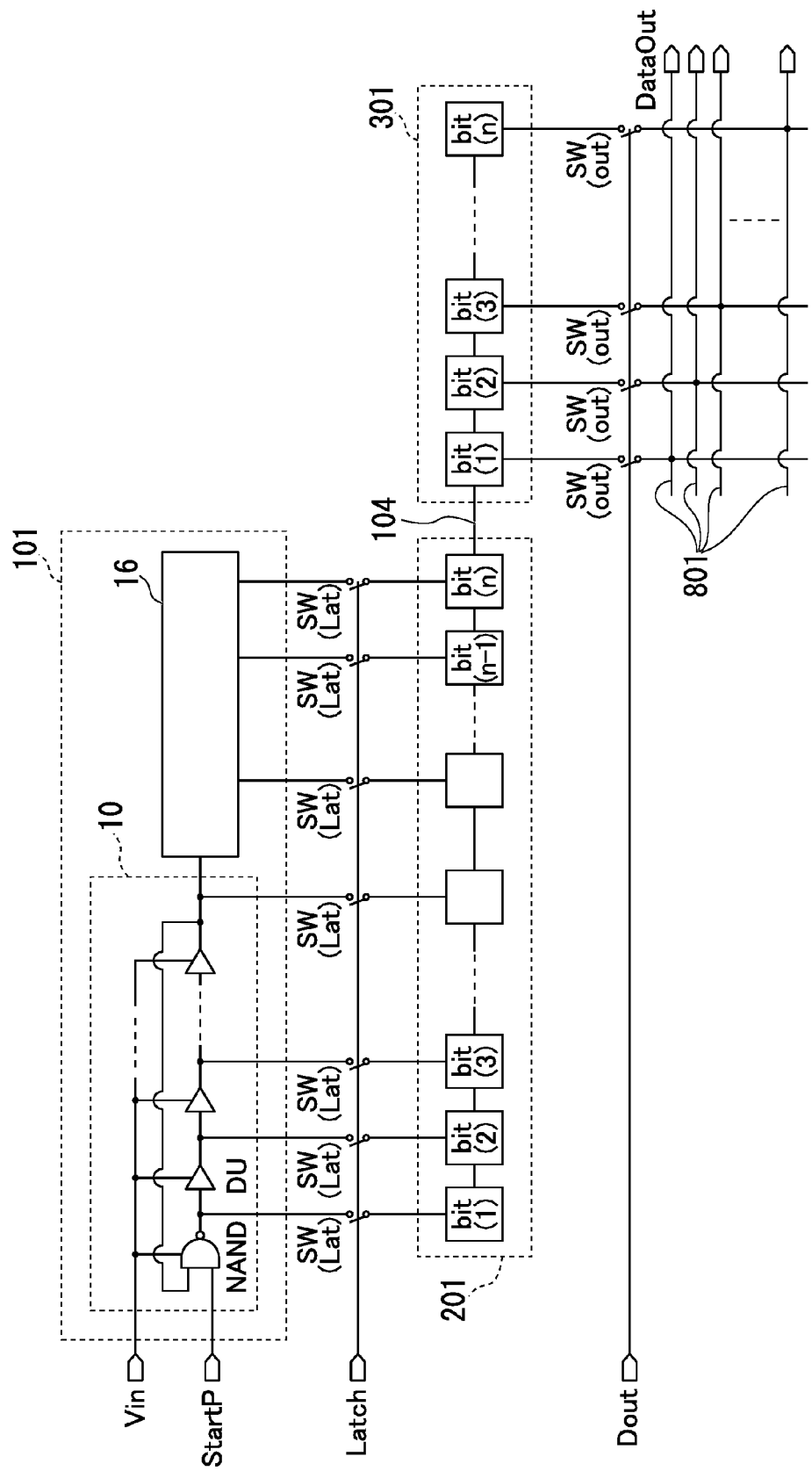
FIG. 4 is a circuit connection diagram illustrating an example of a connection of the signal transfer circuit in the image sensor in accordance with the first applicable aspect of the present invention.

Next, a detailed configuration of the image sensor 1 to which the signal transfer circuit in accordance with the first preferred embodiment of the present invention is applied will be described with reference to FIG. 4. FIG. 4 is a circuit connection diagram illustrating an example of a connection of the signal transfer circuit in the image sensor 1 in accordance with the first applicable aspect of the present invention. FIG. 4 illustrates a circuit configuration and a circuit connection of the AD converting circuit 101, the latch circuit 201, the signal transfer line 104, the memory circuit 301, and the horizontal signal line 801 which are connected to one column of the pixel array 102 in the image sensor 1 illustrated in FIG. 3. In other words, the circuit configuration illustrated in FIG. 4 illustrates the AD converting circuit 101 serving as a digital signal generating circuit that outputs a digital signal and the signal transfer circuit in accordance with the first preferred embodiment of the present invention.

The AD converting circuit 101 includes a pulse transit circuit 10 and a counter 16. The pulse transit circuit 10 is configured such that a NAND type pulse delay circuit NAND, in which a pulse signal StartP is input to one input terminal and an output of a buffer type pulse delay circuit DU of a last stage of the pulse transit circuit 10 is input to the other input terminal, is connected with a plurality of buffer type pulse delay circuits DU in a ring form. The NAND type pulse delay circuit NAND and the plurality of buffer type pulse delay circuits DU are supplied with the pixel analog signal Vin input from the CDS circuit 401 as electric power. The pulse transit circuit 10 causes the signal of the pulse signal StartP input to one input terminal of the NAND type pulse delay circuit NAND to propagate with a delay time according to a voltage value of electric power (the pixel analog signal Vin). In the following description, the NAND type pulse delay circuit NAND and the plurality of buffer type pulse delay circuits DU are referred to as a "pulse delay circuit" when not individually distinguished from each other. The counter 16 calculates the circling number of the pulse signal StartP that propagates along the pulse transit circuit 10 based on the output of the pulse delay circuit (the buffer type pulse delay circuit DU) of the last stage of the pulse transit circuit 10.

The latch circuit 201 includes latches bit(1) to bit(n) that correspond to output signals of the pulse delay circuits of the pulse transit circuit 10 and output signals of respective digits of the counter 16, and hold the output signals. The output signals of the pulse delay circuits in the pulse transit circuit 10 and the output signals of the respective digits of the counter 16 are input to the latch circuit 201 through the switches SW(Lat) corresponding to the respective output signals. The switches SW(Lat) are signal line connection switches for performing switching between a connection or a disconnection of the output signal lines of the pulse delay circuits in the pulse transit circuit 10 and the output signal lines of the respective digits of the counter 16, and are turned on or off by a clock signal Latch. The latch circuit 201 holds the input output signals at a timing when the switches SW(Lat) are turned on by the clock signal Latch. The clock signal Latch is a signal included in the driving control signal output from the timing generator 701. In other words, a timing when the latch circuit 201 holds the output signal output from the AD converting circuit 101 is controlled by the timing generator 701.

The memory circuit 301 includes memories bit(1) to bit(n) that hold the output signals transferred from the latches bit(1) to bit(n) in the latch circuit 201. The memory circuit 301 outputs the held output signals to the horizontal signal line 801 through the switches SW(out). The switches SW(out) are signal connection switches that perform switching between a connection and a disconnection of the output signal lines from the memory circuit 301, and are turned on or off by a clock signal Dout. When the switches SW(out) are turned on by the clock signal Dout, the memory circuit 301 outputs the held output signals to the horizontal signal line 801. The clock signal Dout is a driving control signal output from the horizontal scanning circuit 501. In other words, a timing when the memory circuit 301 outputs the output signals held in the memories bit(1) to bit(n) to the horizontal signal line 801 is controlled by the horizontal scanning circuit 501.

Figure 5:
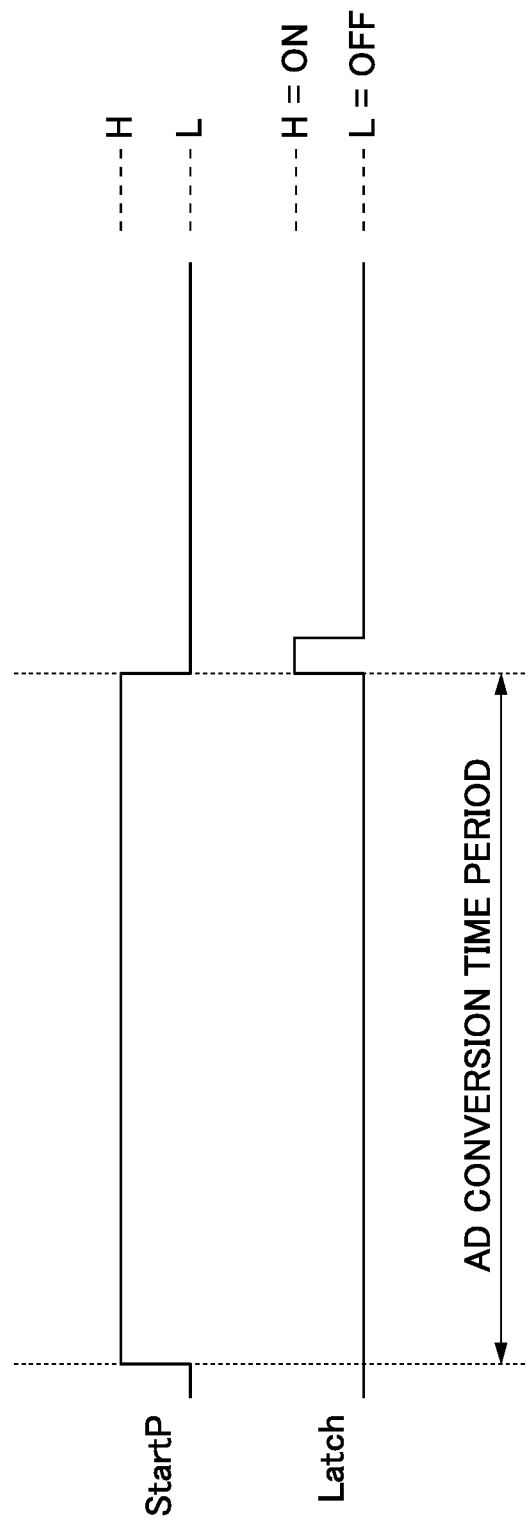
FIG. 5 is a timing chart illustrating an operation of the AD converting circuit in the image sensor in accordance with the first applicable aspect of the present invention.

Next, an operation of the AD converting circuit 101 will be described with reference to FIGS. 4 and 5. FIG. 5 is a timing chart illustrating an operation of the AD converting circuit 101 in the image sensor 1 in accordance with the first applicable aspect of the present invention. First, when the pulse signal StartP transitions to the "H" level in a state in which the pixel analog signal Vin serving as a target of AD conversion is supplied from the CDS circuit 401 as electric power of the pulse transit circuit 10, the AD converting circuit 101 starts AD conversion. During an AD conversion time period, a pulse of the "H" level of the pulse signal StartP propagates along the pulse transit circuit 10 with a delay time according to a voltage value of the pixel analog signal Vin.

Thereafter, when the AD conversion time period ends, the clock signal Latch transitions to the "H" level, and thus the switch SW(Lat) is turned on (a latch operation at a driving timing of the signal transfer circuit in accordance with the first preferred embodiment of the present invention illustrated in FIG. 2). As a result, the output signals of the respective digits of the counter 16 that has measured the circling number of the pulse signal StartP propagating along the AD converting circuit 101 and the output signals of the pulse delay circuits in the pulse transit circuit 10 are held in the latches bit(1) to bit(n) in the latch circuit 201. The output signals held in the latches bit(1) to bit(n) disposed in the latch circuit 201 are the n-bit digital signal obtained when the AD converting circuit 101 performs AD conversion on the pixel analog signal Vin (the analog signal).

Thereafter, the output signals held in the latch circuit 201 are transferred to the memory circuit 301 according to a driving timing to transfer the digital signal illustrated in FIG. 2. The transferred output signals are output to the outside as the output signals of the image sensor 1 of the first applicable aspect of the present invention through the horizontal signal line 801.

Figure 6:
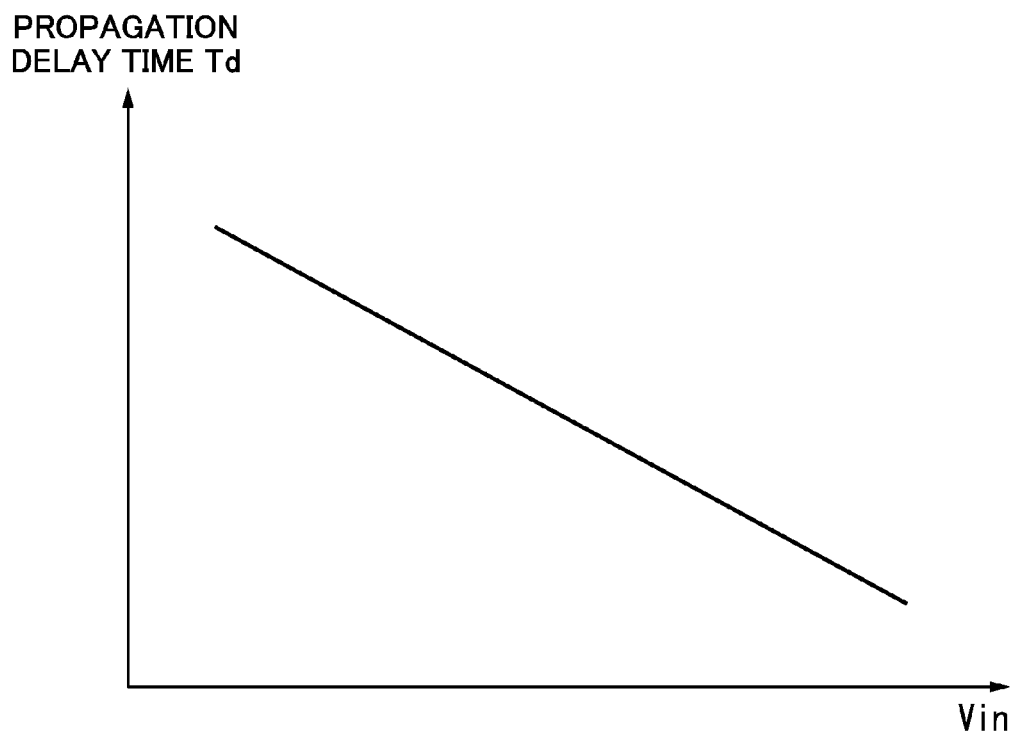
FIG. 6 is a graph illustrating a relationship between an input voltage and a propagation delay time of a pulse propagating therein in the AD converting circuit in accordance with the first applicable aspect of the present invention.

Here, a relationship between an input voltage of the AD converting circuit and a propagation delay time of a pulse propagating along the AD converting circuit, that is, a relationship between an analog signal input to the AD converting circuit and a digital signal output from the AD converting circuit, will be described. FIG. 6 is a graph illustrating a relationship between an input voltage and a propagation delay time of a pulse propagating therein in the AD converting circuit 101 in accordance with the first applicable aspect of the present invention. Particularly, FIG. 6 illustrates a relationship between the level of the pixel analog signal Vin which is the input voltage of the AD converting circuit 101 and the propagation delay time of the pulse signal StartP that propagates along the pulse transit circuit 10. As illustrated in FIG. 6, in the AD converting circuit 101, when the voltage value of the pixel analog signal Vin is low, the propagation delay time Td of the pulse signal StartP in the pulse transit circuit 10 increases. Further, when the pixel analog signal Vin is high, the propagation delay time Td of the pulse signal StartP in the pulse transit circuit 10 decreases. In other words, the circling number of the pulse signal StartP that propagates along the AD converting circuit 101 or an output signal of each of the pulse delay circuits of the pulse transit circuit 10 changes depending on the level of the pixel analog signal Vin, and the AD converting circuit 101 outputs the output signal corresponding to the propagation delay time Td of the pulse signal StartP as the digital signal.

Here, the accuracy of AD conversion of the AD converting circuit will be described. In the AD converting circuit of the type such as the AD converting circuit 101, for example, when the same pixel analog signal Vin is input to the AD converting circuit 101, as the propagation speed of the pulse signal StartP that propagates along the pulse transit circuit 10 increases, the accuracy of AD conversion increases. For this reason, in the AD converting circuit of the type such as the AD converting circuit 101, it is desirable to arrange the bit circuit near the pulse delay circuit in the pulse transit circuit 10 disposed therein and reduce an output load of each pulse delay circuit. In this regard, in the image sensor 1 including the AD converting circuit 101 in a narrow area such as a column of an image sensor, the bit circuit is arranged between the pulse delay circuits.

Figure 12:
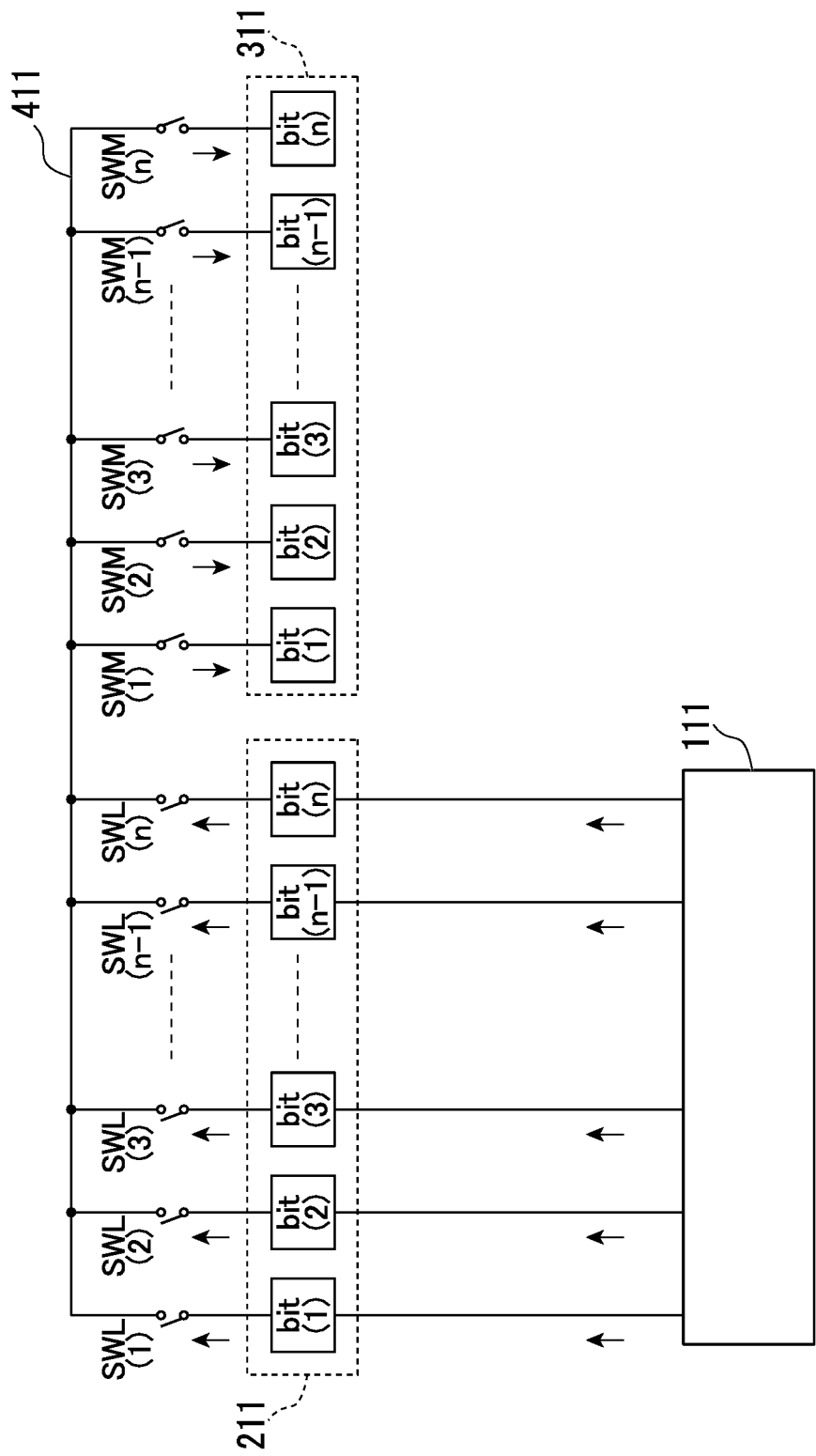
FIG. 12 is a circuit connection diagram illustrating an example of a connection of components related to transfer of a digital signal in an image sensor in accordance with the related art.

Here, the example in which the signal transfer circuit of the related art illustrated in FIG. 12 is arranged in each column of the image sensor will be considered. In the signal transfer circuit of the related art, the line length of the signal transfer line 411 is long, and parasitic resistance is large. In addition, many switches are connected to the signal transfer line 411, and parasitic capacitance is large. For this reason, in order to operate the signal transfer circuit of the related art at a high speed and reliably transfer the digital signal, the latch in the latch circuit 211 needs to secure sufficient driving capability, and thus the circuit size of each latch increases. When the latches with the large circuit size are arranged between the pulse delay circuits in the pulse transit circuit 10 disposed in the AD converting circuit 101, there is a restriction that the latches should be arranged in a column direction due to a narrow arrangement area. Due to this arrangement restriction, the pulse delay circuits are arranged at positions apart from each other, and thus the line length between the pulse delay circuits increases. As a result, the propagation delay time Td of the pulse signal StartP includes a delay time by the line length between the pulse delay circuits as well as a delay time by the voltage value of the pixel analog signal Vin serving as electric power of each of the pulse delay circuits. As described above, when the latch with the large circuit size is arranged between the pulse delay circuits, the delay time due to the length of the line between the pulse delay circuits degrades AD conversion performance.

The signal transfer circuit in accordance with the first preferred embodiment of the present invention can reduce the circuit size of the bit circuit. Thus even when the bit circuit with the small circuit size is arranged between the pulse delay circuits in the pulse transit circuit 10 disposed in the AD converting circuit 101, the line length between the pulse delay circuits does not increase. Thus, the propagation delay time Td of the pulse signal StartP includes only the delay time by the voltage value of the pixel analog signal Vin serving as electric power of each pulse delay circuit. Accordingly, when the signal transfer circuit in accordance with the first preferred embodiment of the present invention is applied to the image sensor including the AD converting circuit for each column, it is possible to prevent the AD conversion performance of the AD converting circuit from degrading, and thus the accuracy of AD conversion can be increased.

Figure 13:
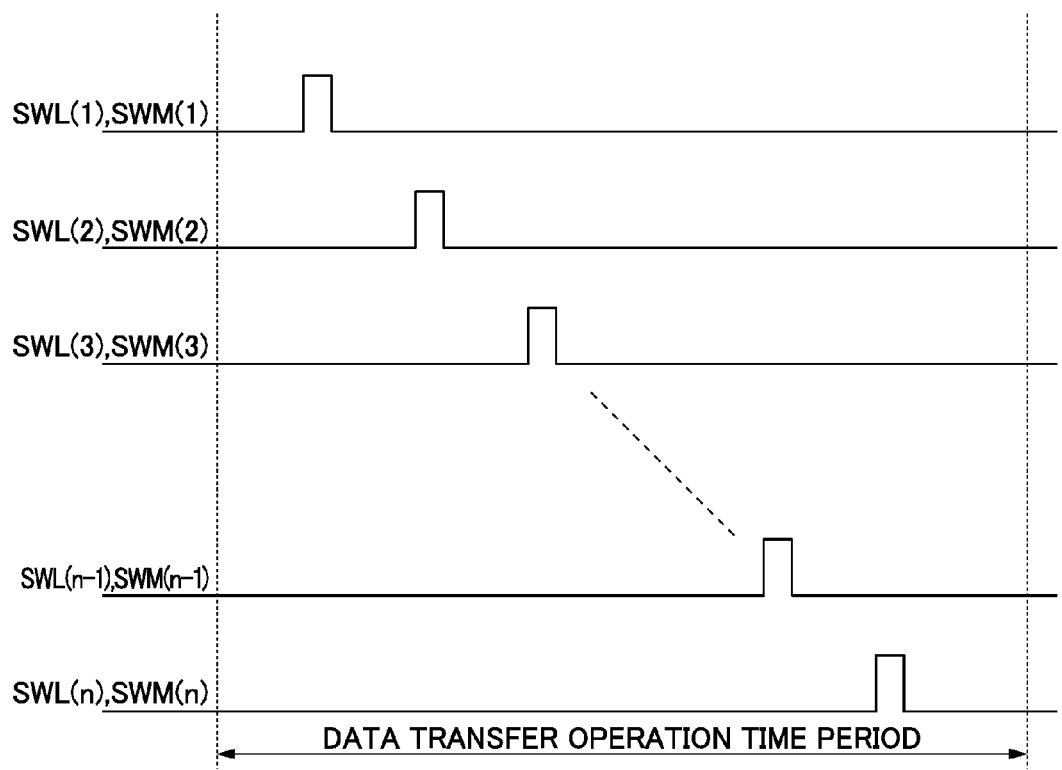
FIG. 13 is a timing chart illustrating a driving timing to transfer the digital signal in the signal transfer circuit of the image sensor in accordance with the related art.

In addition, the signal transfer circuit in accordance with the first preferred embodiment of the present invention can reduce the number of signal lines of the driving control signal used to control transfer of the digital signal compared to the signal transfer circuit of the related art. Thus, when the signal transfer circuit is applied to the image sensor including the AD converting circuit for each column, a degree of freedom of an arrangement of respective components can be improved. For example, the signal transfer circuit of the related art illustrated in FIG. 12 needs to output n (corresponding to the number of bits) driving control signals (see FIG. 13) in order to transfer the n-bit digital signal. In the signal transfer circuit in accordance with the first preferred embodiment of the present invention, the digital signal can be transferred by a total of four driving control signals used to control the switches SW1 to SW3 and xSW3 regardless of the number of bits of the digital signal transferred by the signal transfer circuit. Thus, in the image sensor 1 to which the signal transfer circuit in accordance with the first preferred embodiment of the present invention is applied, the number of signal lines of the driving control signal output from the timing generator 701 can be reduced. In addition, as the number of signal lines is reduced, the degree of freedom of wiring in the image sensor 1 is improved.

Second Applicable Aspect

Figure 7:
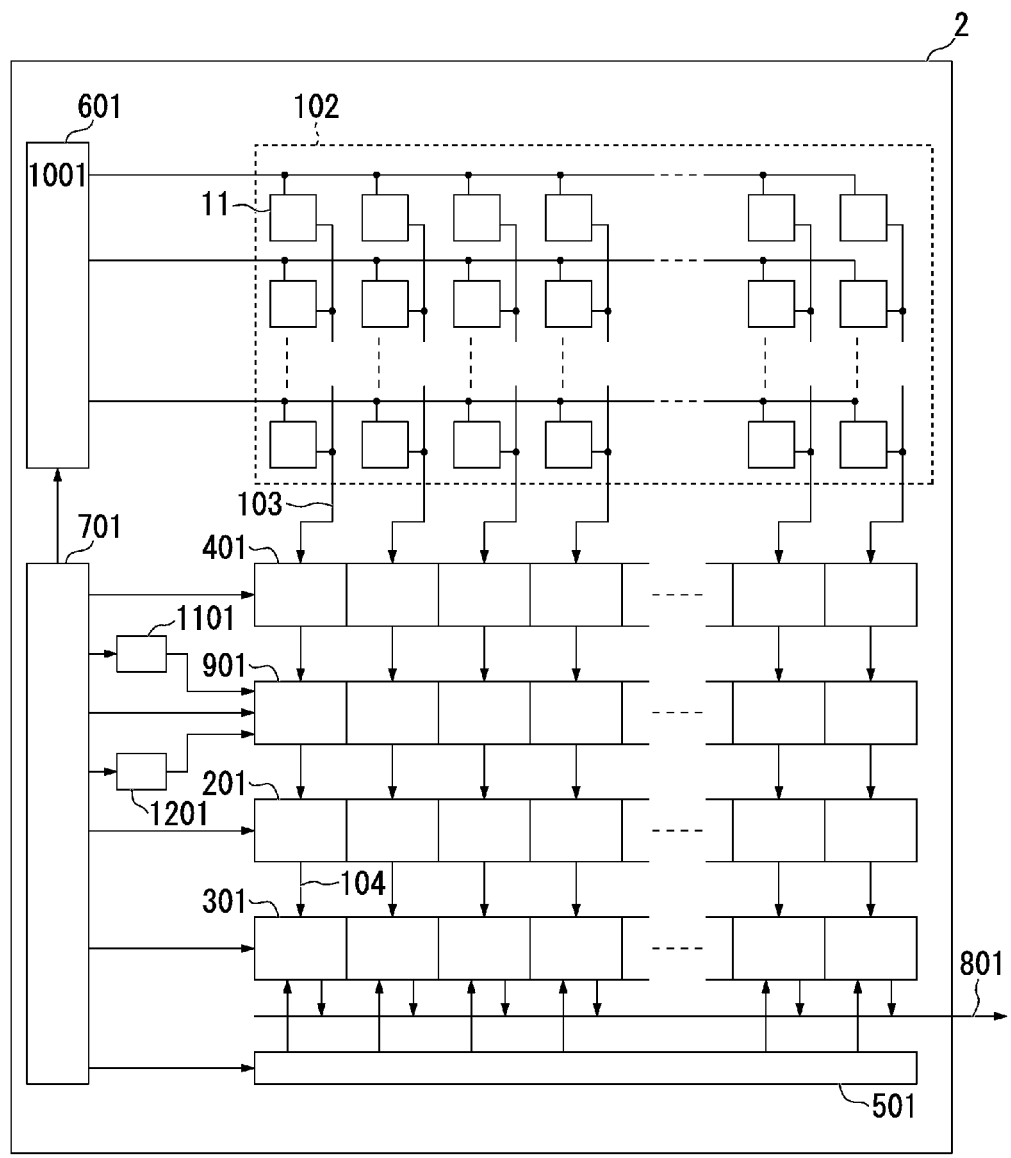
FIG. 7 is a block diagram illustrating a schematic configuration of an image sensor in accordance with a second applicable aspect in which the signal transfer circuit in accordance with the first preferred embodiment of the present invention is applied to the image sensor.

Next, the description will proceed with another example in which the signal transfer circuit in accordance with the first preferred embodiment of the present invention is applied to the image sensor. FIG. 7 is a block diagram illustrating a schematic configuration of an image sensor in accordance with a second applicable aspect in which the signal transfer circuit in accordance with the first preferred embodiment of the present invention is applied to the image sensor. Referring to FIG. 7, an image sensor 2 includes a pixel array 102, a plurality of vertical signal lines 103, a plurality of CDS circuits 401, a plurality of AD converting circuits 901, a plurality of latch circuits 201, a plurality of signal transfer lines 104, a plurality of memory circuits 301, a horizontal scanning circuit 501, a vertical scanning circuit 601, a timing generator 701, a horizontal signal line 801, a reference ramp signal generating circuit 1101, and a reference clock signal generating circuit 1201.

The image sensor 2 in accordance with the second applicable aspect of the present invention is different from the image sensor 1 of the first applicable aspect illustrated in FIG. 3 in that an AD converting circuit 901 is provided instead of the AD converting circuit 101, and a reference ramp signal generating circuit 1101 and a reference clock signal generating circuit 1201 are further provided. Due to the above configuration difference, the timing generator 701 further outputs a driving control signal used to drive each of the reference ramp signal generating circuit 1101 and the reference clock signal generating circuit 1201. Further, the signal transfer circuit in the image sensor 2 in accordance with the second applicable aspect of the present invention is similar to that of the image sensor 1 of the first applicable aspect illustrated in FIG. 3 except that a digital signal output from the AD converting circuit 901 is input rather than output from the AD converting circuit 101. Thus, the same components as in the image sensor 1 of the first applicable aspect illustrated in FIG. 3 are denoted by the same reference numerals, and a detailed description thereof will not be provided.

The reference ramp signal generating circuit 1101 outputs a reference ramp signal RAMP used to perform a comparison of the pixel analog signal Vin to the AD converting circuit 901.

The reference clock signal generating circuit 1201 outputs a reference clock signal CLK used to measure a time period from the start of AD conversion operation to the end thereof to the AD converting circuit 901.

The AD converting circuit 901 is arranged to correspond to the CDS circuit 401 of each column, and converts the pixel analog signal Vin input from the CDS circuit 401 into the n-bit digital signal based on the reference ramp signal RAMP input from the reference ramp signal generating circuit 1101 and the reference clock signal CLK input from the reference clock signal generating circuit 1201.

Figure 8:
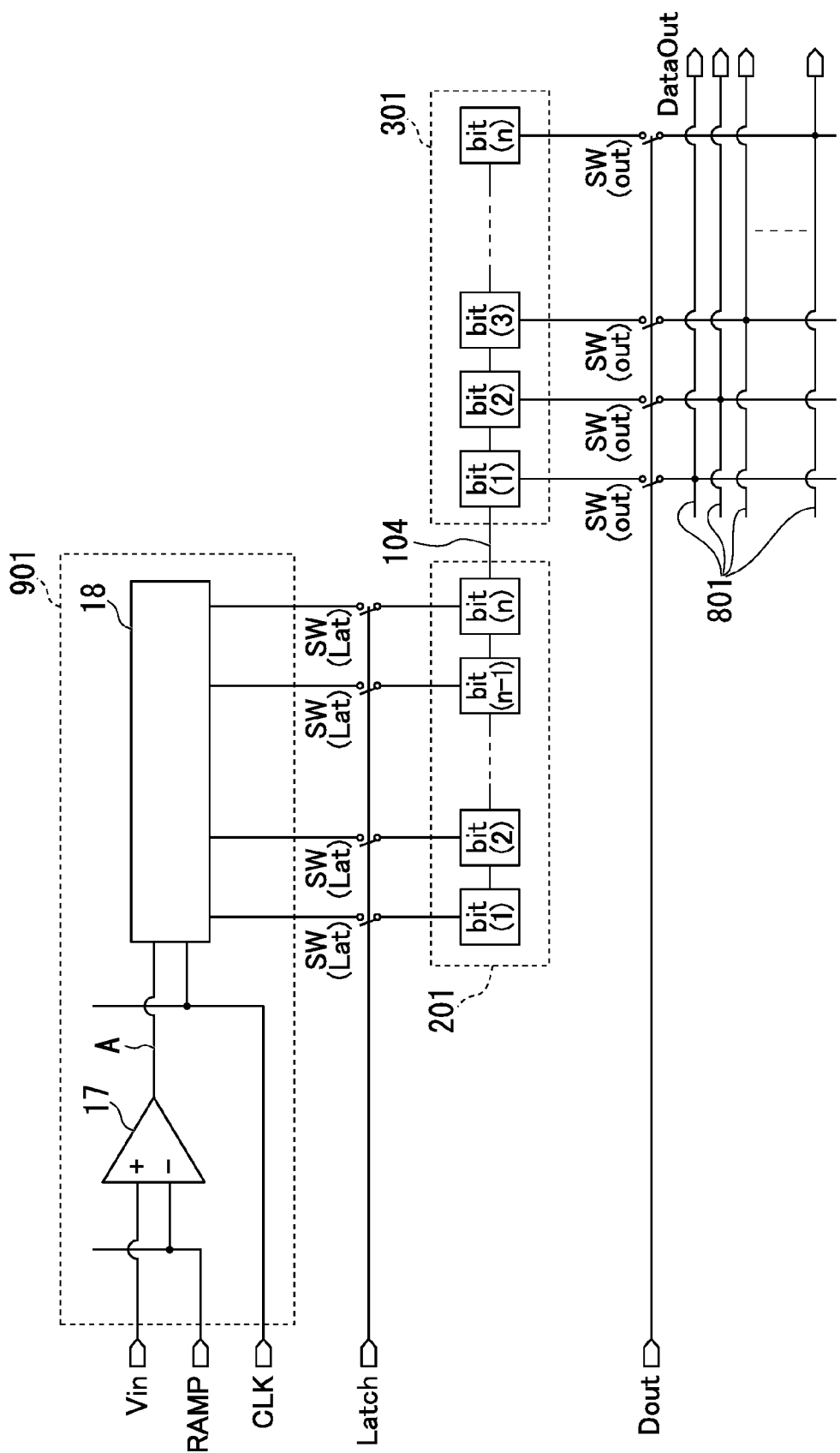
FIG. 8 is a circuit connection diagram illustrating an example of a connection of the signal transfer circuit in the image sensor in accordance with the second applicable aspect of the present invention.

Next, a detailed configuration of the image sensor 2 to which the signal transfer circuit in accordance with the first preferred embodiment of the present invention is applied will be described with reference to FIG. 8. FIG. 8 is a circuit connection diagram illustrating an example of a connection of the signal transfer circuit in the image sensor 2 in accordance with the second applicable aspect of the present invention. FIG. 8 illustrates a circuit configuration and a circuit connection of the AD converting circuit 901, the latch circuit 201, the signal transfer line 104, the memory circuit 301, and the horizontal signal line 801 which are connected to one column of the pixel array 102 in the image sensor 2 illustrated in FIG. 7. In other words, the circuit configuration illustrated in FIG. 8 illustrates the AD converting circuit 901 that is a digital signal generating circuit that outputs a digital signal and the signal transfer circuit in accordance with the first preferred embodiment of the present invention.

The AD converting circuit 901 includes a comparator 17 and a counter 18. The comparator 17 includes one input terminal (+terminal) to which the pixel analog signal Vin from the CDS circuit 401 is input and the other input terminal (−terminal) to which the reference ramp signal RAMP from the reference ramp signal generating circuit 1101 is input. The comparator 17 outputs an inversion signal A when a magnitude relationship between voltages input to the input terminal (+terminal) and the input terminal (−terminal) is switched. The counter 18 detects a timing at which the inversion signal A output from the comparator 17 is switched based on the reference clock signal CLK input from the reference clock signal generating circuit 1201. The counter 18 starts measurement of the number of clocks of the reference clock signal CLK when an AD conversion operation starts, and ends measurement of the number of clocks of the reference clock signal CLK at a timing at which the inversion signal A of the comparator 17 is switched.

The latch circuit 201 includes latches bit(1) to bit(n) that correspond to output signals of respective digits of the counter 18 and hold the output signals. The output signals of the respective digits of the counter 18 are input to the latch circuit 201 through the switches SW(Lat) corresponding to the respective output signals. The switches SW(Lat) are signal line connection switches for performing switching between a connection or a disconnection of the output signal lines of the respective digits of the counter 18, and are turned on or off by a clock signal Latch. The latch circuit 201 holds the input output signals at a timing when the switches SW(Lat) are turned on by the clock signal Latch. The clock signal Latch is a signal included in the driving control signal output from the timing generator 701. In other words, a timing when the latch circuit 201 holds the output signal output from the AD converting circuit 901 is controlled by the timing generator 701.

The memory circuit 301 includes memories bit(1) to bit(n) that hold the output signals transferred from the latches bit(1) to bit(n) in the latch circuit 201. The memory circuit 301 outputs the held output signals to the horizontal signal line 801 through the switches SW(out). The switches SW(out) are signal connection switches that perform switching between a connection and a disconnection of the output signal lines from the memory circuit 301, and turned on or off by a clock signal Dout. When the switches SW(out) are turned on by the clock signal Dout, the memory circuit 301 outputs the held output signals to the horizontal signal line 801. The clock signal Dout is a driving control signal output from the horizontal scanning circuit 501. In other words, a timing when the memory circuit 301 outputs the output signals held in the memories bit(1) to bit(n) to the horizontal signal line 801 is controlled by the horizontal scanning circuit 501.

Figure 9:
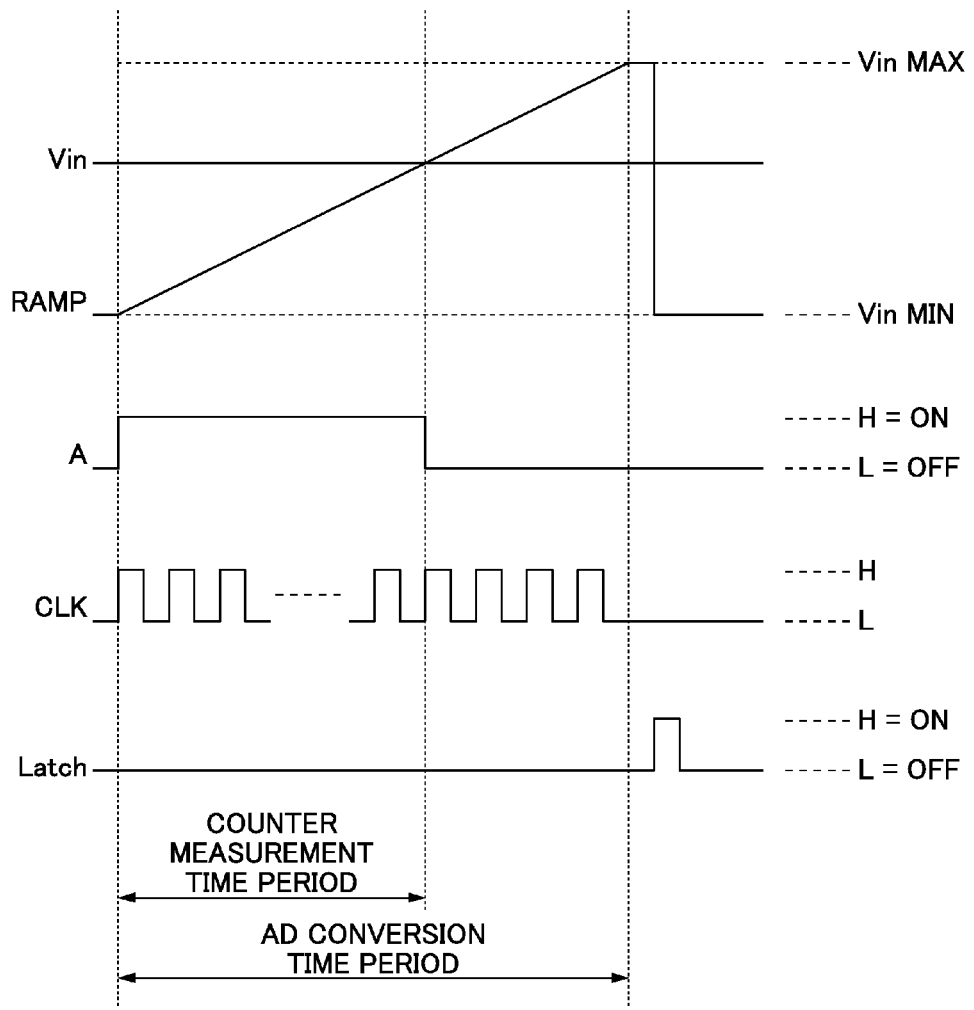
FIG. 9 is a timing chart illustrating an operation of the AD converting circuit in the image sensor in accordance with the second applicable aspect of the present invention.

Next, an operation of the AD converting circuit 101 will be described with reference to FIGS. 8 and 9. FIG. 9 is a timing chart illustrating an operation of the AD converting circuit 901 in the image sensor 2 in accordance with the second applicable aspect of the present invention. First, when an AD conversion operation starts in a state in which the pixel analog signal Vin serving as a target of AD conversion from the CDS circuit 401 is input to the input terminal (+terminal) of the comparator 17, the reference ramp signal RAMP that changes from a minimum voltage VinMIN of the pixel analog signal Vin to a maximum voltage VinMAX thereof is input from the reference ramp signal generating circuit 1101 to the input terminal (−terminal) of the comparator 17. Further, at the same time, the reference clock signal CLK is input from the reference clock signal generating circuit 1201 to the counter 18. Then, the counter 18 starts measurement of the reference clock signal CLK.

Thereafter, the voltage of the reference ramp signal RAMP increases, and then when voltage of the reference ramp signal RAMP is larger than the voltage of the pixel analog signal Vin, the inversion signal A output from the comparator 17 is inverted. The counter 18 stops measurement of the number of clocks of the reference clock signal CLK at a timing at which the inversion signal A is inverted.

Thereafter, after the AD conversion time period ends, the clock signal Latch transitions to the "H" level, and the switch SW(Lat) is turned on (the latch operation at the driving timing of the signal transfer circuit in accordance with the first preferred embodiment of the present invention illustrated in FIG. 2). As a result, the measurement result of the number of clocks of the reference clock signal CLK measured by the counter 18 is held in the latches bit(1) to bit(n) in the latch circuit 201. The measurement result of the number of clocks of the reference clock signal CLK measured by the counter 18 which is held in the latches bit(1) to bit(n) disposed in the latch circuit 201 is the n-bit digital signal obtained when the AD converting circuit 901 performs AD conversion on the pixel analog signal Vin (the analog signal).

Thereafter, similarly to the image sensor 1 in accordance with the first applicable aspect illustrated in FIG. 3, the measurement result held in the latch circuit 201 is transferred to the memory circuit 301 according to the driving timing to transfer the digital signal illustrated in FIG. 2. Then, the transferred measurement result is output to the outside through the horizontal signal line 801 as the output signal of the image sensor 2 in accordance with the second applicable aspect of the present invention.

Here, the accuracy of AD conversion of the AD converting circuit will be described. In the AD converting circuit of the type such as the AD converting circuit 901, for example, when the same pixel analog signal Vin is input to the AD converting circuit 901, as the speed at which the counter 18 measures the number of clocks of the reference clock signal CLK increases, the accuracy of AD conversion increases. For this reason, in the AD converting circuit of the type such as the AD converting circuit 901, it is desirable for the counter 18 to perform the measurement operation on the reference clock signal CLK at a higher speed. However, when the circuit size of each bit circuit increases, the output load of the counter 18 increases. For this reason, it is necessary to increase the circuit size of the counter 18 so that the counter 18 can secure sufficient driving capability. However, the increase in the circuit size of the counter 18 reduces the operation speed of the counter 18, and thus the accuracy of AD conversion decreases.

The signal transfer circuit in accordance with the first preferred embodiment of the present invention can reduce the circuit size of the bit circuit. Thus, the output load when the digital signal is output from the counter 18 disposed in the AD converting circuit 901 to the latch circuit 201 is small. As a result, the circuit size of the counter 18 can be reduced, and thus the counter 18 that can measure the number of clocks based on the reference clock signal CLK at the high speed can be configured. Accordingly, the operation speed of the counter 18 can be prevented from decreasing, and AD conversion performance can be increased.

In addition, in the signal transfer circuit in accordance with the first preferred embodiment of the present invention, similarly to the image sensor 1 of the first applicable aspect illustrated in FIG. 3, it is possible to reduce the number of signal lines of the driving control signal used to control transfer of the digital signal to be smaller than the signal transfer circuit of the related art, and a degree of freedom of an arrangement of the components of the image sensor 2 in accordance with the second applicable aspect of the present invention can be improved. Further, in the image sensor 2 in accordance with the second applicable aspect of the present invention, the number of signal lines of the driving control signal output from the timing generator 701 can be reduced, and a degree of freedom of wiring in the image sensor 2 can be improved.

Second Preferred Embodiment

Figure 10:
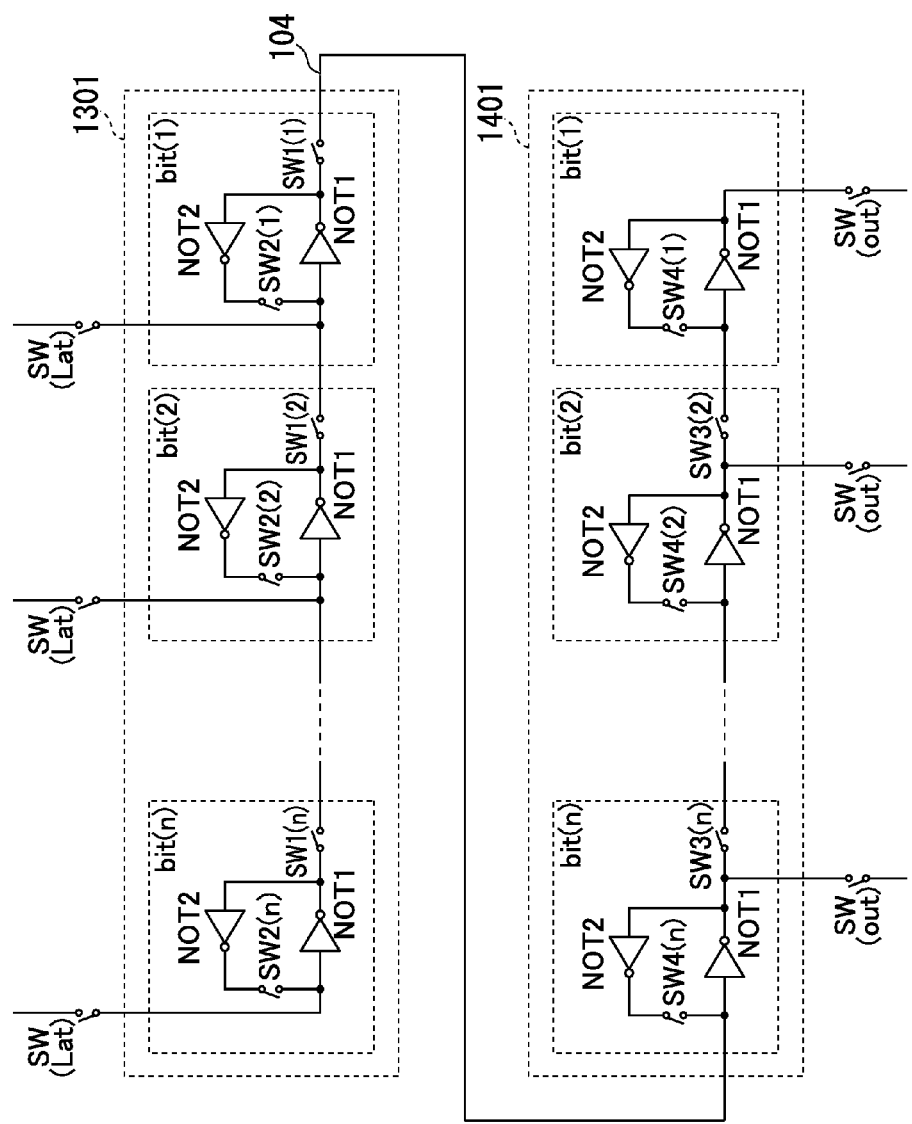
FIG. 10 is a circuit connection diagram illustrating an example of a detailed configuration of a signal transfer circuit in accordance with the second preferred embodiment of the present invention.

Next, a second preferred embodiment of the present invention will be described with reference to the accompanying drawings. FIG. 10 is a circuit connection diagram illustrating an example of a detailed configuration of a signal transfer circuit in accordance with the second preferred embodiment of the present invention. A signal transfer circuit illustrated in FIG. 10 includes switches SW(Lat), a latch circuit 1301, a signal transfer line 104, a memory circuit 1401, and switches SW(out). The latches bit(1) to bit(n) of the latch circuit 1301 have a circuit configuration similar to the memories bit(1) to bit(n) of the memory circuit 1401. Here, the difference lies in that, since the digital signal output from the digital signal generating circuit that outputs the digital signal such as the AD converting circuit is input to the latch circuit 1301, and the memory circuit 1401 outputs the held digital signal to the outside, that is, due to the functional difference, the connection position of the switch SW(Lat) is different from the connection position of the switch SW(out). Further, a number in "( ) parentheses" following a symbol of each component illustrated in FIG. 10 represents a bit of a digital signal. For example, a second bit of a digital signal is represented by "(2)."

First, components which are common in the latches bit(1) to bit(n) and the memories bit(1) to bit(n) will be described. In the following description, the latches bit(1) to bit(n) and the memories bit(1) to bit(n) are referred to as a "bit circuit."

The bit circuit includes two inverting circuits NOT1 and NOT2 and two switches (SW1 and SW2 in the latch circuit 1301 and SW3 and SW4 in the memory circuit 1401). The inverting circuit NOT1 includes an input terminal connected to an output side end of the switch SW2 or the switch SW4 and an output terminal which is connected to an input terminal of the inverting circuit NOT2 and an input side end of the switch SW1 or the switch SW3. The inverting circuit NOT2 includes an input terminal connected to an output of the inverting circuit NOT1 and an output terminal connected to an input side end of the switch SW2 or the switch SW4.

Next, a connection between the bit circuits used as the latches bit(1) to bit(n) and the bit circuits used as the memories bit(1) to bit(n) will be described. The bit circuits used as the latches bit(1) to bit(n) are configured such that an output side end of the switch SW(Lat) is further connected to the input terminal of the inverting circuit NOT1, and the digital signal output from the digital signal generating circuit is input through the switch SW(Lat).

Further, in the bit circuits used as the latches bit(l) to bit(n−1), the input terminal of the inverting circuit NOT1 is further connected to an output side end of the switch SW1 of the latches bit(2) to bit(n), and all the latches bit(1) to bit(n) are serially connected to each other (for example, tied in a row).

Further, the bit circuits used as the memories bit(1) to bit(n) are configured such that the output terminal of the inverting circuit NOT1 is further connected to the input side end of the switch SW(out), and the digital signal held in the bit circuit is output to the outside through the switch SW(out). Further, in the bit circuits used as the memories bit(1) to bit(n−1), the input terminal of the inverting circuit NOT1 is further connected to an output side end of the switch SW3 of the memories bit(2) to bit(n), and all the memories bit(1) to bit(n) are serially connected to each other (for example, tied in a row).

The output side end of the switch SW1 of the latch bit(1) is connected to the signal transfer line 104, and the signal transfer line 104 is further connected to the input terminal of the inverting circuit NOT1 of the memory bit(n). As described above, in the signal transfer circuit illustrated in FIG. 10, the latches bit(1) to bit(n) in the latch circuit 1301 and the memories bit(1) to bit(n) in the memory circuit 1401 are connected in the order of bits of the digital signals indicated by "( ): parentheses," and the latch circuit 1301 is further connected with the memory circuit 1401 through the signal transfer line 104.

Figure 11:
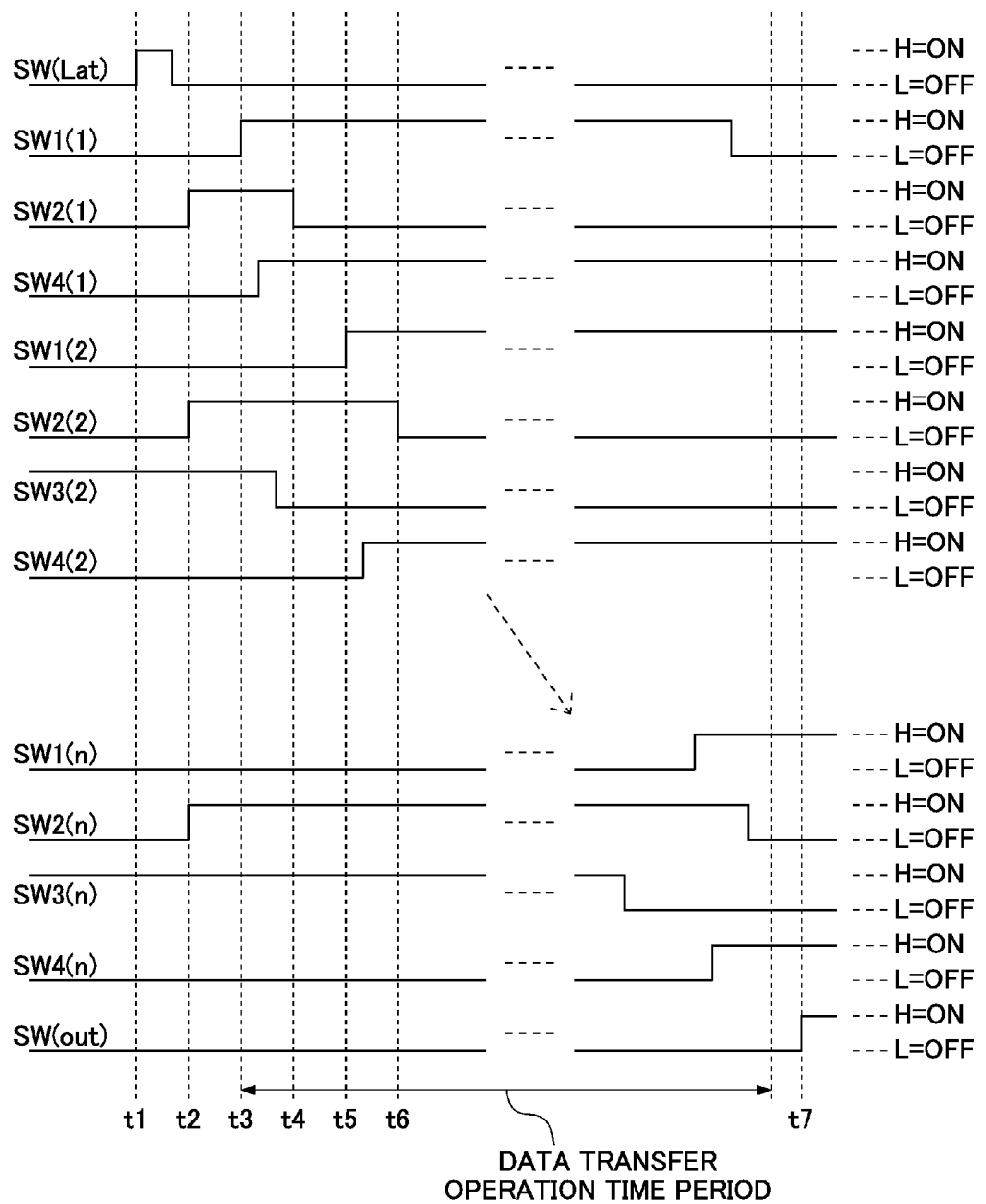
FIG. 11 is a timing chart illustrating a driving timing to transfer a digital signal in the signal transfer circuit in accordance with the second preferred embodiment of the present invention.

Next, transfer control of the digital signal (signal information) in the signal transfer circuit will be described with reference to FIGS. 10 and 11. FIG. 11 is a timing chart illustrating a driving timing to transfer a digital signal in the signal transfer circuit in accordance with the second preferred embodiment of the present invention. The timing chart illustrated in FIG. 11 represents a driving timing when the signal information held in the latch circuit 1301 of the signal transfer circuit illustrated in FIG. 10 is sequentially transferred to the memory circuit 1401. In transfer control of the digital signal (signal information) in the signal transfer circuit in accordance with the second preferred embodiment of the present invention, an ON/OFF operation of each of the switches (the switch SW(Lat), the switch SW(out), and the switches SW1 to SW4) is controlled by a driving control signal input from a timing control circuit (not illustrated). The following description will proceed with an example in which the state of each switch of the signal transfer circuit illustrated in FIG. 10 becomes a connection (ON) state when the driving control signal from the timing control circuit is at an "H" level, and becomes a disconnection (OFF) state when the driving control signal from the timing control circuit is at an "L" level. Further, the transfer control of the digital signal (signal information) will be described based on the status (ON or OFF) of each switch, and the level of the driving control signal input from the timing control circuit will also be described together.

First, when the switch SW(Lat) is turned on (the driving control signal transitions to the "H" level) in a state in which the switches SW1, SW2, and SW4 are turned off (the driving control signal has the "L" level) and the switch SW3 is turned on (the driving control signal has the "H" level), the latch operation of the digital signal is performed. Through the latch operation, the digital signal output from the digital signal generating circuit is input to the input terminal of the inverting circuit NOT1 of the latches bit(1) to bit(n) (a timing t1). Thereafter, the switch SW(Lat) is turned off (the driving control signal transitions to the "L" level), and so the switch SW2 is turned on (the driving control signal transitions to the "H" level). As a result, in each of the bit circuits of the latches bit(1) to bit(n), a feed-back loop is formed by the inverting circuit NOT1 and the inverting circuit NOT2, and thus the digital signal output from the digital signal generating circuit is held (a timing t2). Thereafter, in the data transfer operation time period, the digital signal held in the latches bit(1) to bit(n) starts to be transferred to the memories bit(1) to bit(n).

In the transfer of the digital signal, first, as a first transfer operation, the switch SW 1(1) is turned on (the driving control signal transitions to the "H" level. At this time, the switches SW3(2) to SW3(n) are turned on. As a result, the output of the inverting circuit NOT1 of the latch bit(1) propagates along inverting circuit NOT1 of the memories bit(n) to bit(2) in order, and is then input to the inverting circuit NOT1 of the memory bit(1) (a timing t3). Thereafter, the switch SW4(1) is turned on (the driving control signal transitions to the "H" level), and then the switch SW3(2) is turned off (the driving control signal transitions to the "L" level). As a result, the transferred digital signal of the latch bit(1) is held by the feed-back loop formed by the inverting circuit NOT1 and the inverting circuit NOT2 of the memory bit(1). Thereafter, the switch SW2(1) is turned of (the driving control signal transitions to the "L" level). As a result, the feed-back loop formed by the inverting circuit NOT1 and the inverting circuit NOT2 of the latch bit(1) is released (a timing t4). Through the first transfer operation, a digital signal of one bit held in the latch bit(1) moves to the memory bit(1).

Next, as a second transfer operation, the switch SW1(2) is turned on (the driving control signal transitions to the "H" level). At this time, the switch SW1(1) and the switches SW3(3) to SW3(n) are turned on. As a result, the output of the inverting circuit NOT1 of the latch bit(2) propagates along the inverting circuits NOT1 of the latch bit(1) and the memories bit(n) to bit(3) in order, and is then input to the inverting circuit NOT1 of the memory bit(2) (a timing t5). Thereafter, the switch SW4(2) is turned on (the driving control signal transitions to the "H" level), and then the switch SW3(3) is turned off (the driving control signal transitions to the "L" level). As a result, the transferred digital signal of the latch bit(2) is held by the feed-back loop formed by the inverting circuit NOT1 and the inverting circuit NOT2 of the memory bit(2). Thereafter, the switch SW2(2) is turned off (the driving control signal transitions to the "L" level). As a result, the feed-back loop formed by the inverting circuit NOT1 and the inverting circuit NOT2 of the memory bit(2) is released (a timing t6). Through the second transfer operation, a digital signal of one bit held in the latch bit(2) moves to the memory bit(2).

Thereafter, in the data transfer operation time period, the same operation as the first transfer operation and the second transfer operation is repeatedly performed until the digital signal held in the latch bit(n) moves to the memory bit(n), and thus the digital signal output from the digital signal generating circuit moves (is transferred) from the latches bit(1) to bit(n) to the memories bit(1) to bit(n).

Thereafter, the switches SW(out) are turned on (the driving control signal transitions to the "H" level), and thus the outputs of the inverting circuits NOT1 of the memories bit(1) to bit(n) are output to the outside (a timing t7).

As described above, the signal transfer circuit in accordance with the second preferred embodiment of the present invention can reliably transfer the digital signal output from the digital signal generating circuit from the latch circuit 1301 to the memory circuit 1401 bit by bit.

Further, in the signal transfer circuit in accordance with the second preferred embodiment of the present invention, each of the latch bit and the memory bit can be configured with two inverting circuits and two switches. As a result, the signal transfer circuit in accordance with the second preferred embodiment of the present invention can have the circuit size and the circuit area smaller than the configuration of the signal transfer circuit in accordance with the first preferred embodiment illustrated in FIG. 1. Thus, when the signal transfer circuit in accordance with the second preferred embodiment of the present invention is applied to the image sensor 1 and the image sensor 2 instead of the signal transfer circuit of the first preferred embodiment (more specifically, the latch circuit 1301 is applied instead of the latch circuit 201, and the memory circuit 1401 is applied instead of the memory circuit 301), the circuit size and the arrangement area can be further reduced. Accordingly, degradation in the AD conversion performance of the AD converting circuit can be further reduced, and the accuracy of AD conversion can be further increased.

As described above, according to the preferred embodiments of the present invention, it is possible to reliably transfer the digital signal output from the digital signal generating circuit from the latch circuit to the memory circuit without deteriorating the digital signal.

Further, according to the preferred embodiments of the present invention, since the circuit size of the latch circuit and the memory circuit can be reduced, the signal transfer can be reliably performed at a high speed. In addition, since the circuit size of the latch circuit and the memory circuit is small, the signal transfer circuit can be arranged even in a narrow area.

As a result, for example, when the signal transfer circuit of the first preferred embodiment or the signal transfer circuit of the second preferred embodiment is applied to the image sensor in which the AD converting circuit is arranged for each column of the pixel array, the AD conversion result of high accuracy can be obtained without lowering the AD conversion performance of the AD converting circuit which is the digital signal generating circuit that outputs the digital signal. As a result, the image sensor that outputs an image signal (digital signal) of a high quality can be implemented.

In addition, the preferred embodiments of the present invention, for example, the first preferred embodiment, have been described in connection with the example in which the number (n) of bit circuits of the latch circuit 201 is the same as the number of bit circuits of the memory circuit 301. However, the number of bit circuits disposed in the latch circuit 201 and the memory circuit 301 is not limited to the preferred embodiments for embodying the present invention, and the latch circuit 201 and the memory circuit 301 may be configured to have different numbers of bit circuits. For example, the number of bit circuits of the latch circuit 201 may be set to be two times or more as many as the number of bit circuits of the memory circuit 301, and digital signals corresponding to two or more rows may be held in the memory circuit 301. Alternatively, for example, the number of bit circuits of the memory circuit 301 may be set to be smaller than the number of bit circuits of the latch circuit 201, the signal transfer from the latch circuit 201 to the memory circuit 301 may be performed by two or more transfer operations, and the digital signal transferred by two or more transfer operations may be read out to the horizontal signal line 801. Alternatively, for example, the number of bit circuits of the latch circuit 201 may be set to be smaller than the number of bit circuits of the memory circuit 301 such that the number of bit circuits of the latch circuit 201 is the same as the number of bits of either of the pulse transit circuit 10 or the counter 16 of the AD converting circuit 101 illustrated in FIG. 4, and the latch circuit 201 may be shared by the pulse transit circuit 10 and the counter 16.

Furthermore, the preferred embodiments of the present invention, for example, the first applicable aspect, have been described in connection with the example in which the signal transfer circuit is applied to the image sensor in which the AD converting circuit is arranged for each column of the pixel array. However, the application portion of the signal transfer circuit in accordance with the preferred embodiments of the present invention is not limited to the preferred embodiments of the present invention, and can be applied to an example other than the image sensor. Particularly, the effects of the signal transfer circuit in accordance with the preferred embodiment of the present invention are effective when the application portion is a narrow area.

While preferred embodiments of the present invention have been described and illustrated above, it should be understood that these are examples of the present invention and are not to be considered as limiting. Additions, omissions, substitutions, and other modifications can be made without departing from the scope of the present invention.

The present invention can be widely applied to a signal transfer circuit that transfers a digital signal and an image pickup device including a signal transfer circuit.

What is claimed is:

1. A signal transfer circuit comprising:
   first to $n^{th}$ switches that are respectively connected to bits of an n-bit (n is a natural number larger than 1) digital signal output from a digital signal generating circuit and controlled by a transfer control circuit;
   a first memory circuit including first to $n^{th}$ memories that respectively hold bits of the n-bit digital signal input through the first to $n^{th}$ switches and are serially connected to each other;
   a second memory circuit including $(n+1)^{th}$ to $m^{th}$ (m is a natural number larger than 2) memories that hold a digital signal and are serially connected to each other, an output signal of the $n^{th}$ memory of the first memory circuit being input to the $(n+1)^{th}$ memory of a first stage; and
   $(n+1)^{th}$ to $m^{th}$ switches that are connected to output signals of the $(n+1)^{th}$ to $m^{th}$ memories of the second memory circuit and controlled by a read control circuit, wherein
   each of the first memory circuit and the second memory circuit is controlled by the transfer control circuit such that a digital signal held in an $i^{th}$ (i is a natural number which is larger than 1 and equal to or less than n or m) memory is transferred to an $(i+1)^{th}$ memory of a next stage, and
   the n-bit digital signal output from the digital signal generating circuit is transferred from the first memory circuit to the second memory circuit, and then output through the $(n+1)^{th}$ to $m^{th}$ switches.

2. An image pickup device comprising:
   a pixel unit including a plurality of pixels, each of which includes a photoelectric conversion element and outputs a pixel signal corresponding to a quantity of light incident on the photoelectric conversion element, the pixels being two-dimensionally arranged;
   a timing control circuit that controls reading of the pixel signal from the pixel unit;
   an AD converter that outputs a digital signal obtained by performing analog-to-digital conversion on the pixel signal read from the pixel unit;
   the signal transfer circuit according to claim 1; and a horizontal read circuit that sequentially outputs a digital value output from the signal transfer circuit, wherein the AD converter functions as the digital signal generating circuit that outputs a digital signal to the signal transfer circuit, the timing control circuit functions as the transfer control circuit that controls an input of a digital signal to the signal transfer circuit and transfer of a digital signal of the signal transfer circuit, and the horizontal read circuit functions as the read control circuit that controls an output of a digital signal from the signal transfer circuit.

3. The signal transfer circuit according to claim 1, wherein an annular delay circuit that includes a plurality of delay units connected in an annular form and allows a pulse signal to propagate with a delay time according to a level of an analog input voltage and a counter that measures a circling number in which the pulse signal propagates along the annular delay circuit are provided as the digital signal generating circuit that inputs a digital signal, and the signal transfer circuit further comprises an AD converter that outputs each of an output of each delay unit of the annular delay circuit and an output of the counter as a digital signal.

4. The image pickup device according to claim 2, wherein the timing control circuit controls the first to $n^{th}$ switches of the signal transfer circuit by first control signals which are smaller in number than signal lines of a digital signal input to the signal transfer circuit, and the timing control circuit controls the first memory circuit and the second memory circuit of the signal transfer circuit by second control signals which are smaller in number than signal lines of a digital signal transferred by the signal transfer circuit.

5. The image pickup device according to claim 4, wherein all of the first to $n^{th}$ switches of the signal transfer circuit are controlled by the first control signals, and all of the first to $n^{th}$ memories of the first memory circuit of the signal transfer circuit and all of the $(n+1)^{th}$ to $m^{th}$ memories of the second memory circuit are controlled by the second control signals.

6. The image pickup device according to claim 5, wherein a plurality of AD converters and a plurality of signal transfer circuits are arranged for each column of the pixel unit, the timing control circuit controls all the signal transfer circuits arranged for each column of the pixel unit through the first control signal and the second control signal output from the timing control circuit, and the horizontal read circuit sequentially outputs digital values from the plurality of signal transfer circuits.

7. The image pickup device according to claim 2, wherein each of the first to $n^{th}$ memories and the $(n+1)^{th}$ to $m^{th}$ memories holds the digital signal in each bit of one feed-back loop.

* * * * *